(12) United States Patent
Kimura

(10) Patent No.: US 8,243,220 B2
(45) Date of Patent: Aug. 14, 2012

(54) DISPLAY DEVICE

(75) Inventor: Hajime Kimura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/071,917

(22) Filed: Mar. 25, 2011

(65) Prior Publication Data

US 2011/0169810 A1    Jul. 14, 2011

Related U.S. Application Data

(62) Division of application No. 11/274,278, filed on Nov. 16, 2005, now Pat. No. 7,916,263.

(30) Foreign Application Priority Data

Dec. 2, 2004    (JP) .................................. 2004-349792

(51) Int. Cl.
*G02F 1/1343* (2006.01)
*G02F 1/1333* (2006.01)
*G02F 1/1345* (2006.01)

(52) U.S. Cl. ............. 349/38; 349/40; 349/151; 349/152

(58) Field of Classification Search ................... 349/38, 349/40, 151–152
See application file for complete search history.

(56) References Cited

U.S. PATENT DOCUMENTS

| | | | |
|---|---|---|---|
| 5,148,301 A | 9/1992 | Sawatsubashi et al. | |
| 6,072,556 A | 6/2000 | Hirakata et al. | |
| 6,236,444 B1 | 5/2001 | Konuma et al. | |
| 6,239,854 B1 | 5/2001 | Hirakata et al. | |
| 6,323,929 B1 | 11/2001 | Hirakata | |
| 6,355,942 B1 | 3/2002 | Yamazaki et al. | |
| 6,383,327 B1 | 5/2002 | Mase | |
| 6,404,478 B1 * | 6/2002 | Nakashima et al. | 349/149 |
| 6,404,479 B2 * | 6/2002 | Zhang et al. | 349/152 |
| 6,711,236 B2 | 3/2004 | Izuhara | |
| 6,954,249 B2 | 10/2005 | Muramatsu et al. | |

(Continued)

FOREIGN PATENT DOCUMENTS

CN    2354240    12/1999

(Continued)

OTHER PUBLICATIONS

Office Action (Application No. 200510128799.3) dated Jul. 4, 2008.

*Primary Examiner* — Nathanael R Briggs
(74) *Attorney, Agent, or Firm* — Eric J. Robinson; Robinson Intellectual Property Law Office, P.C.

(57) ABSTRACT

It is an object to provide a highly reliable display device. It is a feature an IC is over a substrate and a material layer having the same height is thereover. An IC is provided on one side of the substrate, and a material layer having the same height as the IC is provided on at least another side. Further, an IC is provided on one side of the substrate, and material layers having the same height as the IC are provided on the other sides. Further, an IC is provided on one side of the substrate, and a material layer having the same height as the IC is provided at a corner of the substrate.

22 Claims, 24 Drawing Sheets

U.S. PATENT DOCUMENTS

| | | | |
|---|---|---|---|
| 7,202,931 | B2 | 4/2007 | Chung et al. |
| 7,288,437 | B2 | 10/2007 | Mase |
| 2002/0021399 | A1* | 2/2002 | Higuchi et al. ............... 349/149 |
| 2002/0060767 | A1* | 5/2002 | Muramatsu et al. .......... 349/139 |
| 2002/0110637 | A1 | 8/2002 | Mase |
| 2003/0043331 | A1* | 3/2003 | Oowaki et al. ................ 349/151 |
| 2003/0231276 | A1 | 12/2003 | Miki et al. |

FOREIGN PATENT DOCUMENTS

| | | |
|---|---|---|
| CN | 1357783 | 7/2002 |
| EP | 0 272 678 | 6/1988 |
| EP | 0911681 A | 4/1999 |
| EP | 1420285 | 5/2004 |
| JP | 63-055530 A | 3/1988 |
| JP | 05-210369 A | 8/1993 |
| JP | 06-036037A U | 5/1994 |
| JP | 2553956 | 8/1996 |
| JP | 08-292443 A | 11/1996 |
| JP | 2553956 | 11/1996 |
| JP | 11-109378 A | 4/1999 |
| JP | 2000-131707 A | 5/2000 |
| JP | 2000-223528 | 8/2000 |
| JP | 2001-117525 A | 4/2001 |
| JP | 2001-243893 A | 9/2001 |
| JP | 2003-124428 A | 4/2003 |
| JP | 2003-280028 A | 10/2003 |
| JP | 2004-117526 A | 4/2004 |
| WO | WO-98/48321 | 10/1998 |

* cited by examiner

[FIG. 1]
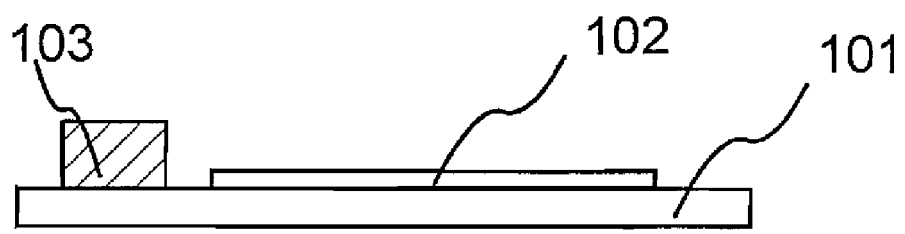

[FIG. 2]
(A)
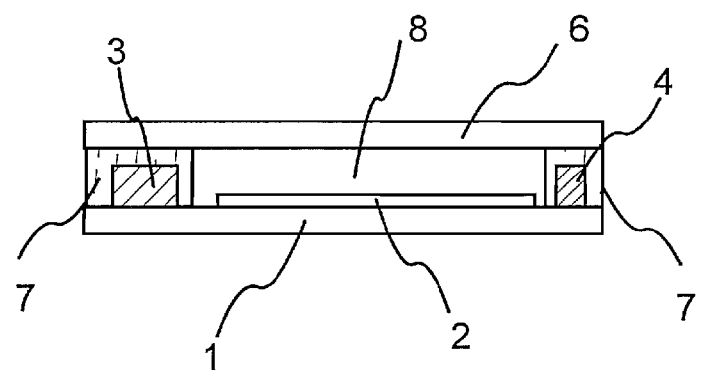
(B)
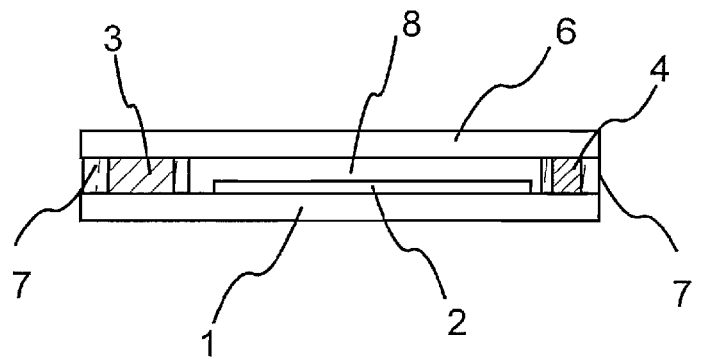

[FIG. 3]
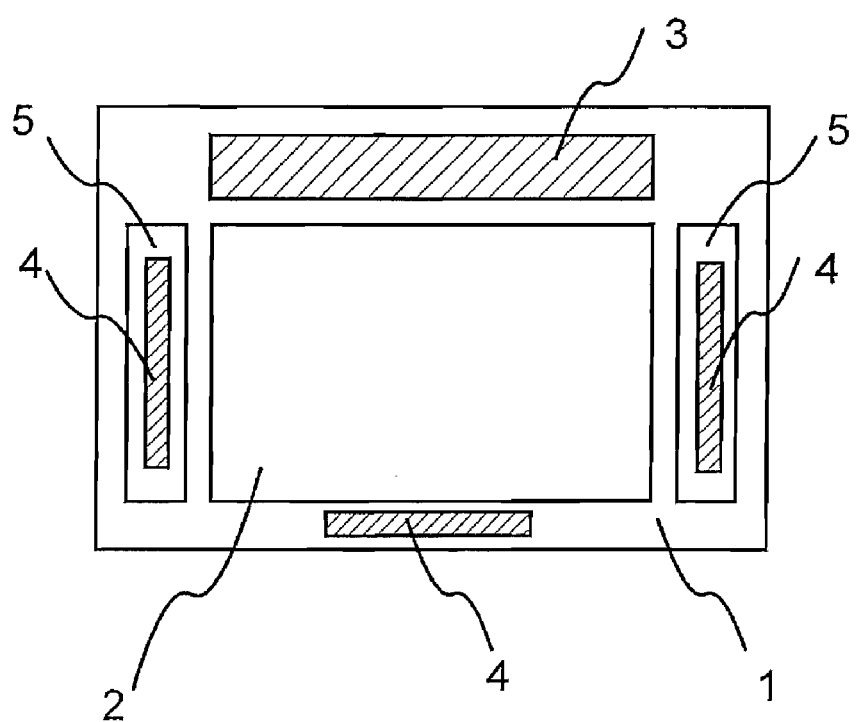

[FIG. 4]
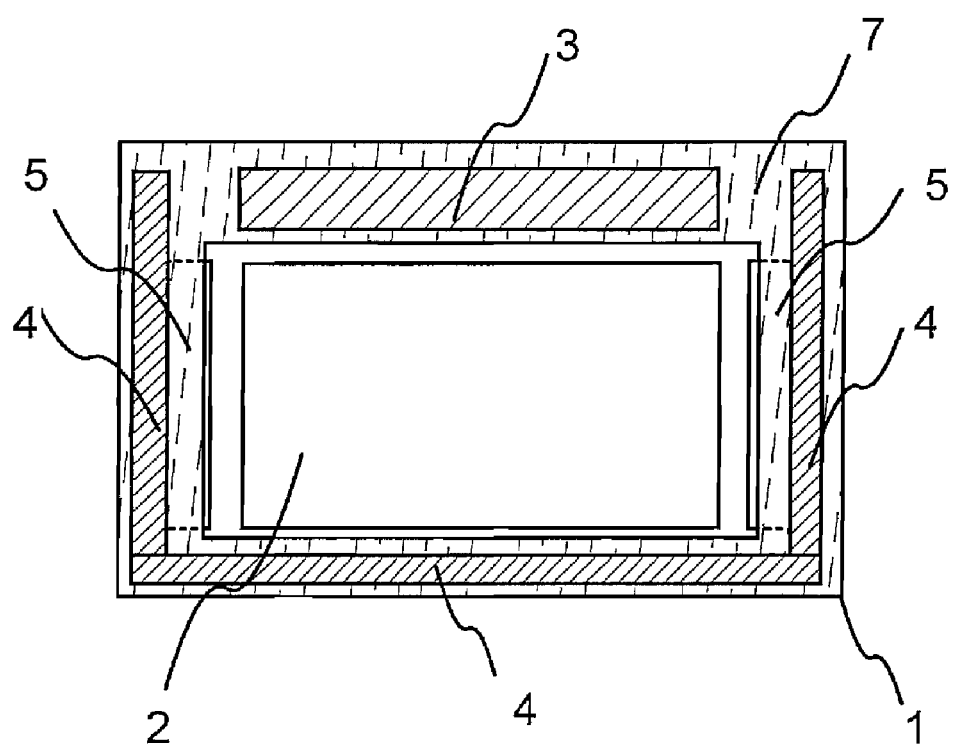

[FIG. 5]
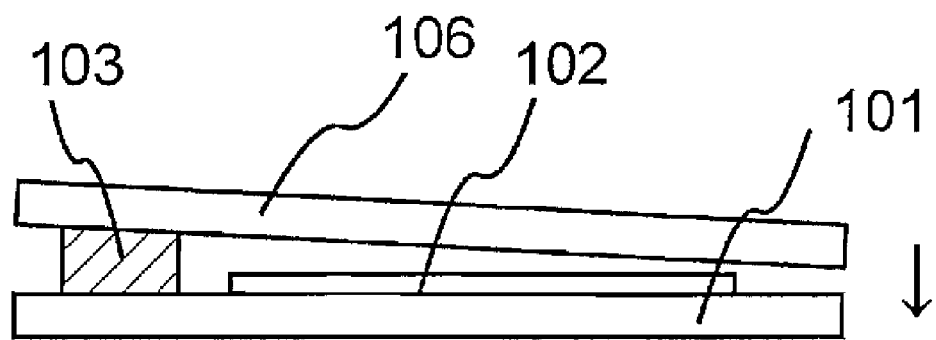

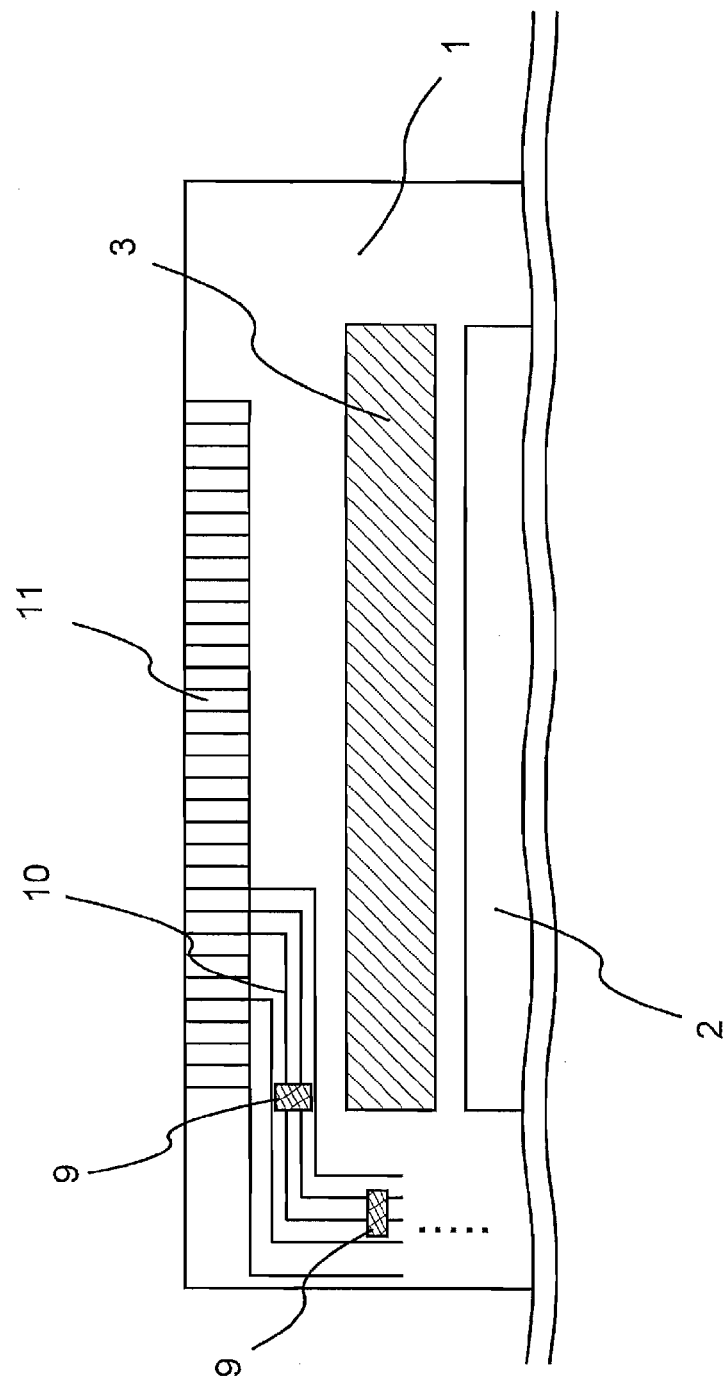

[FIG. 7]
(A)
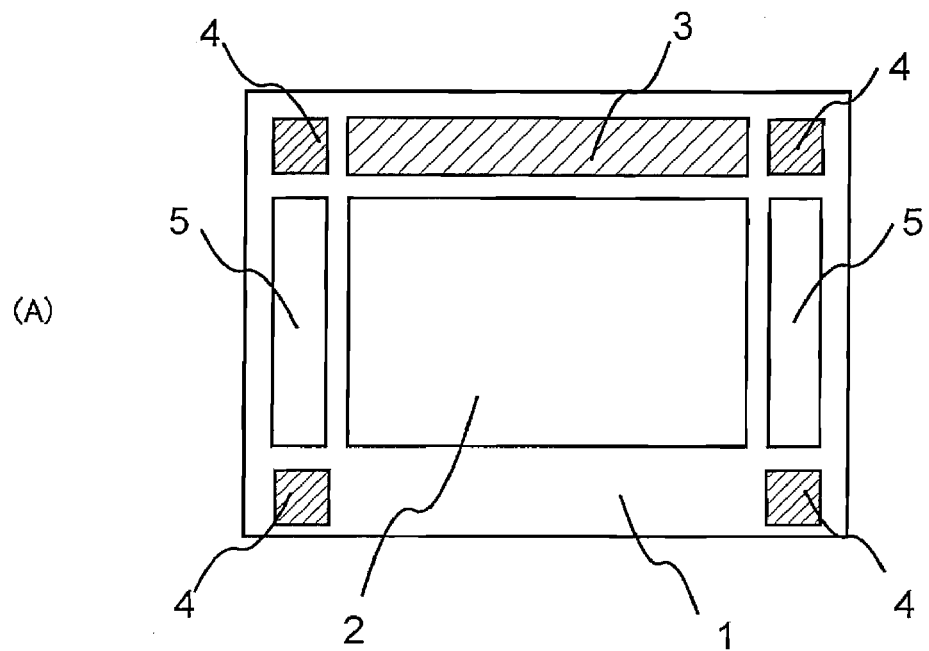
(B)
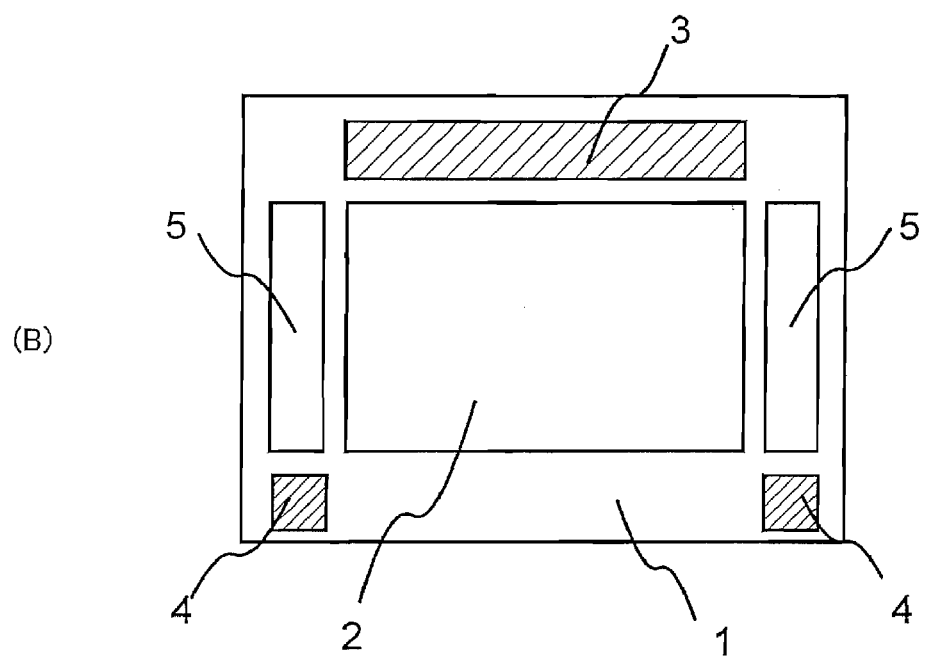

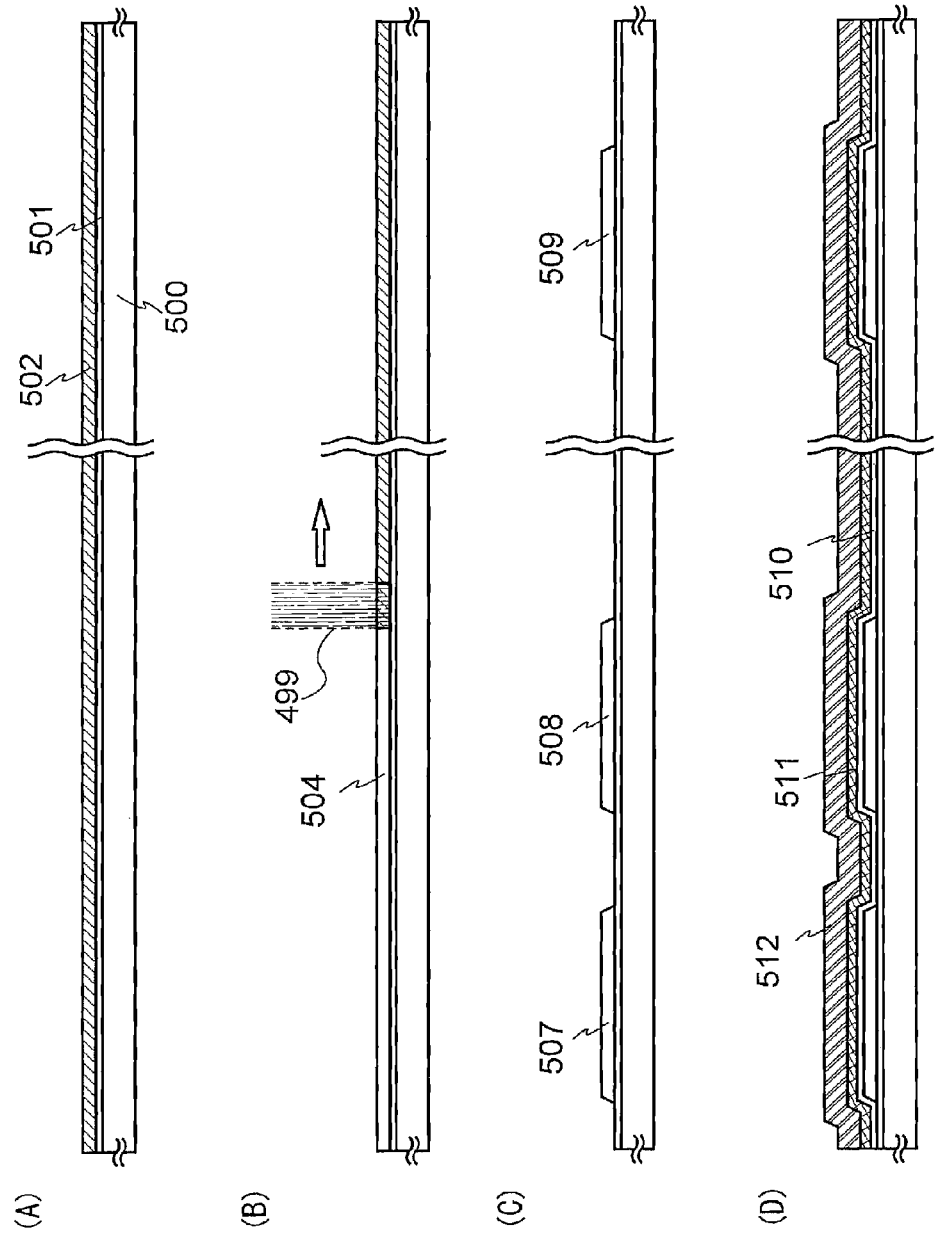

[FIG. 9]
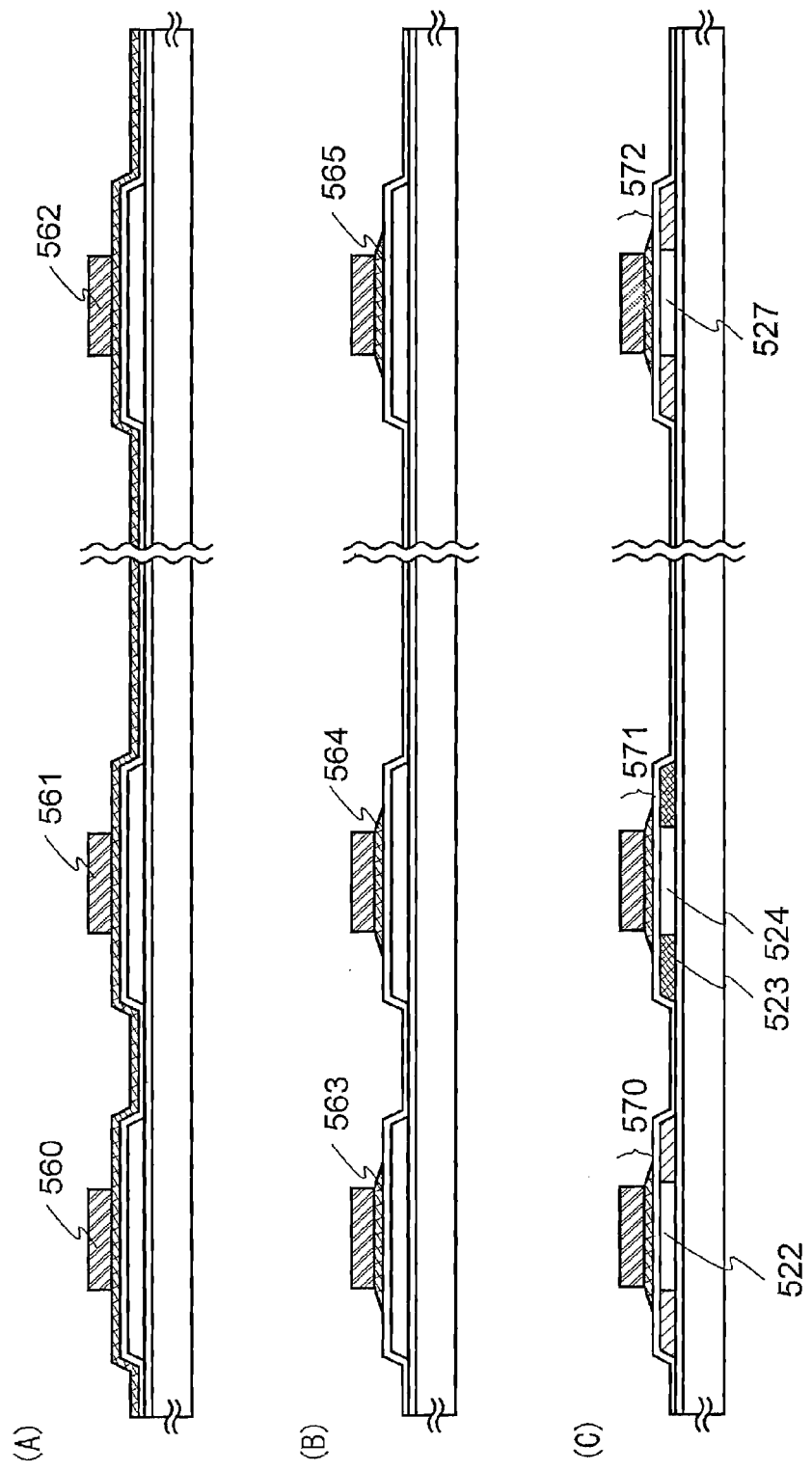

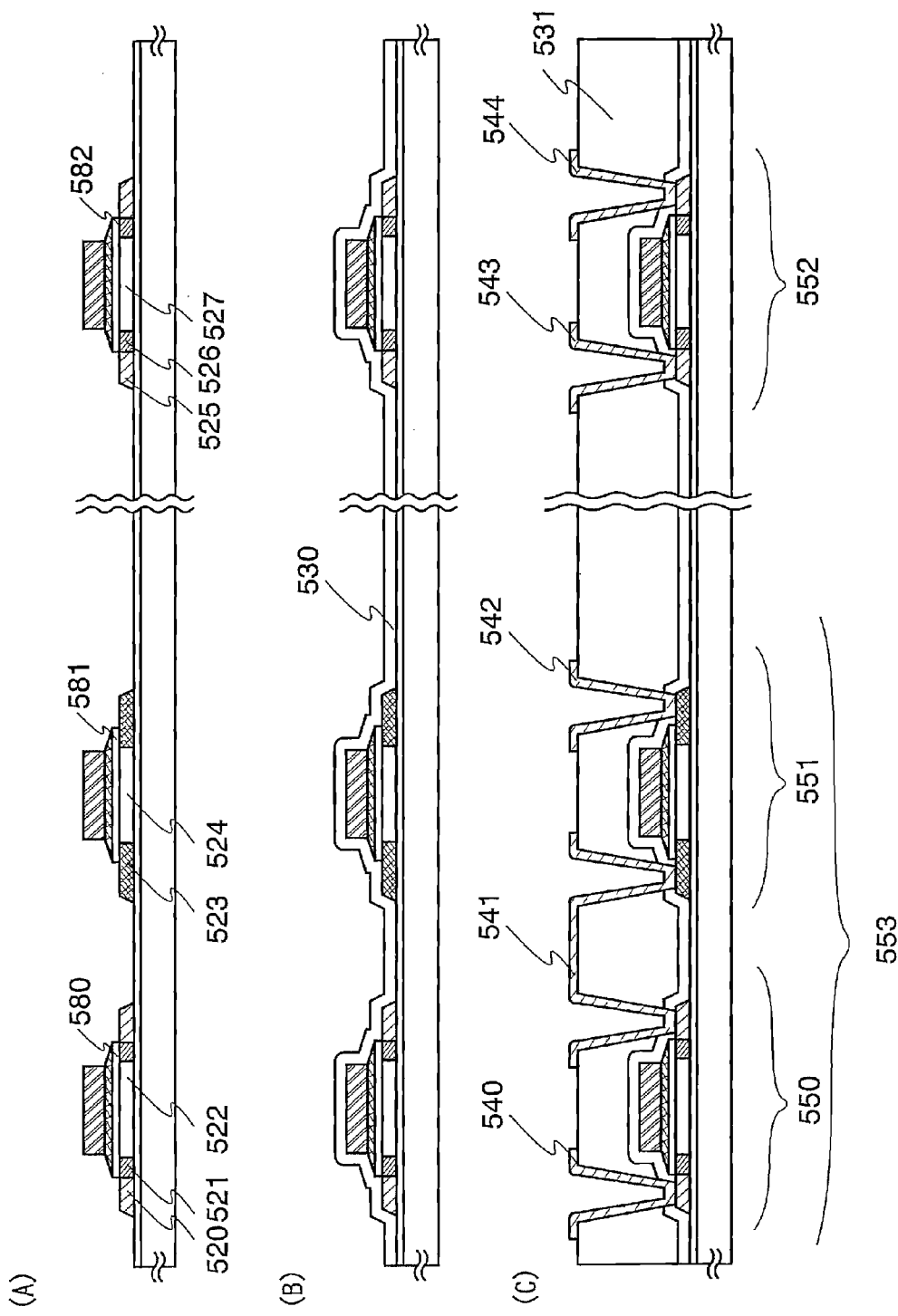

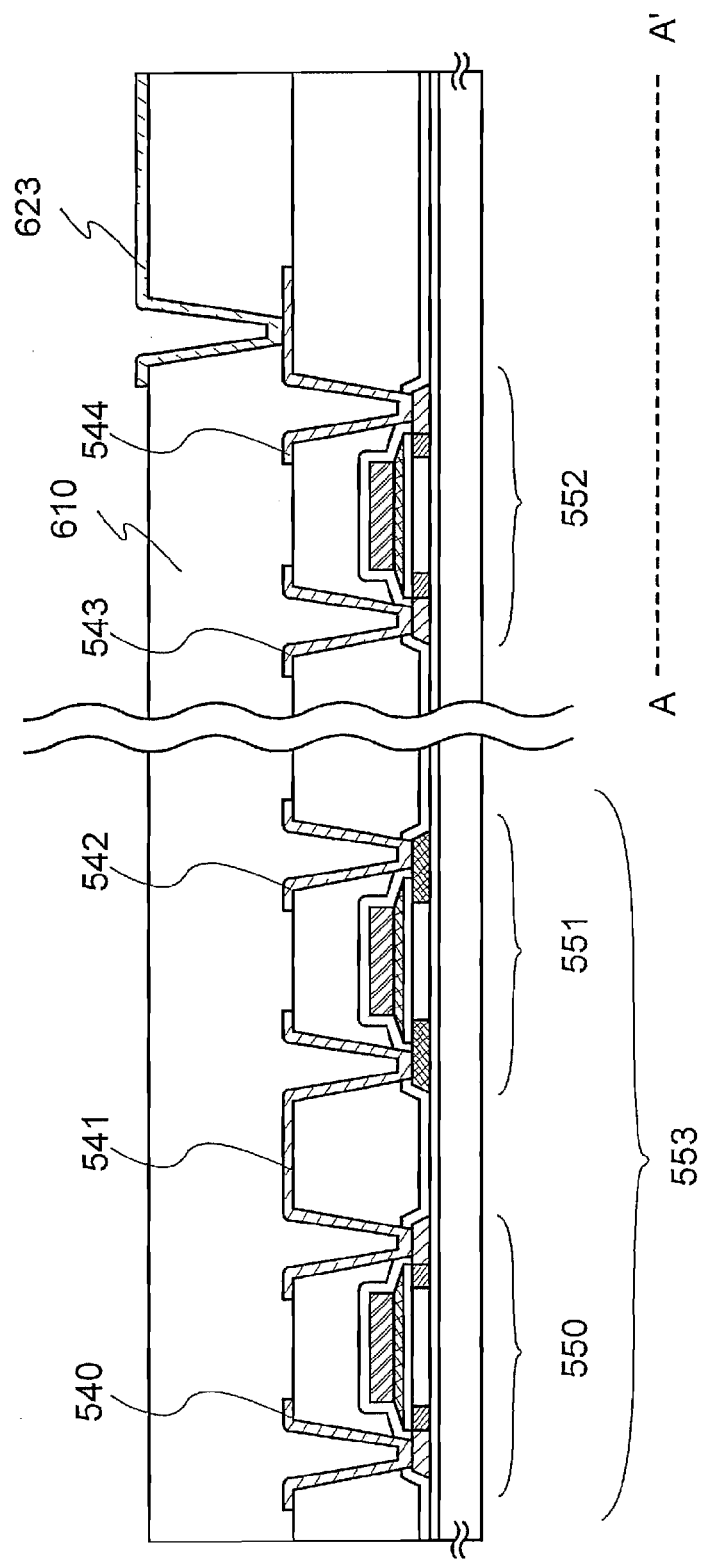

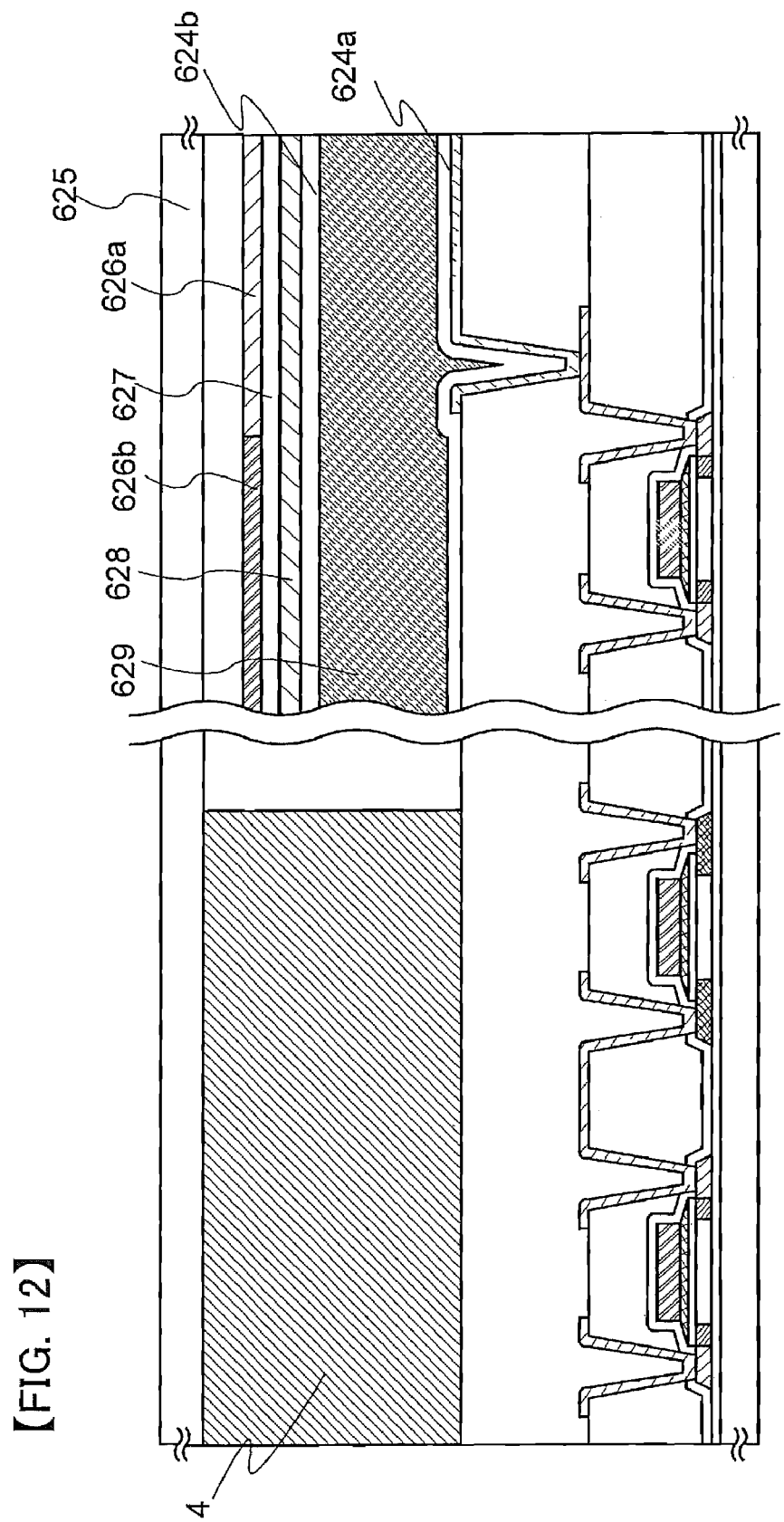
[FIG. 12]

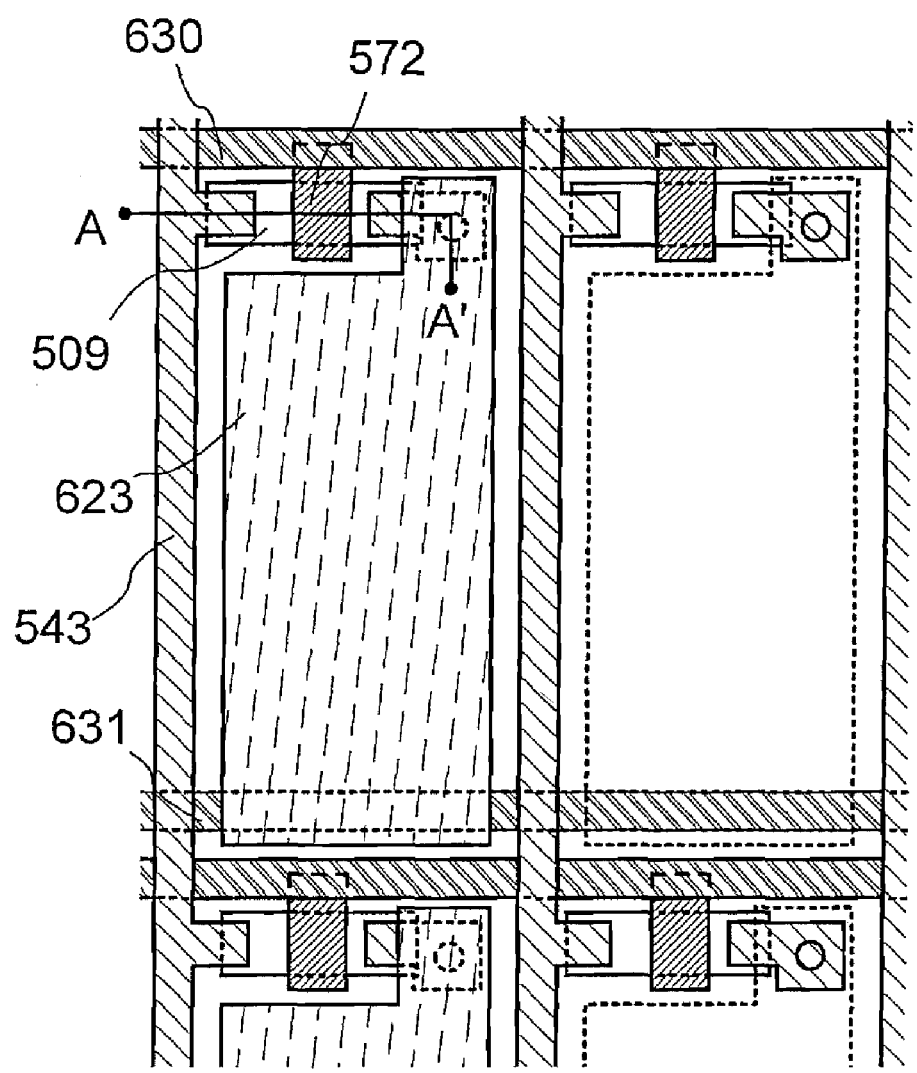
[FIG. 13]

[FIG. 14]
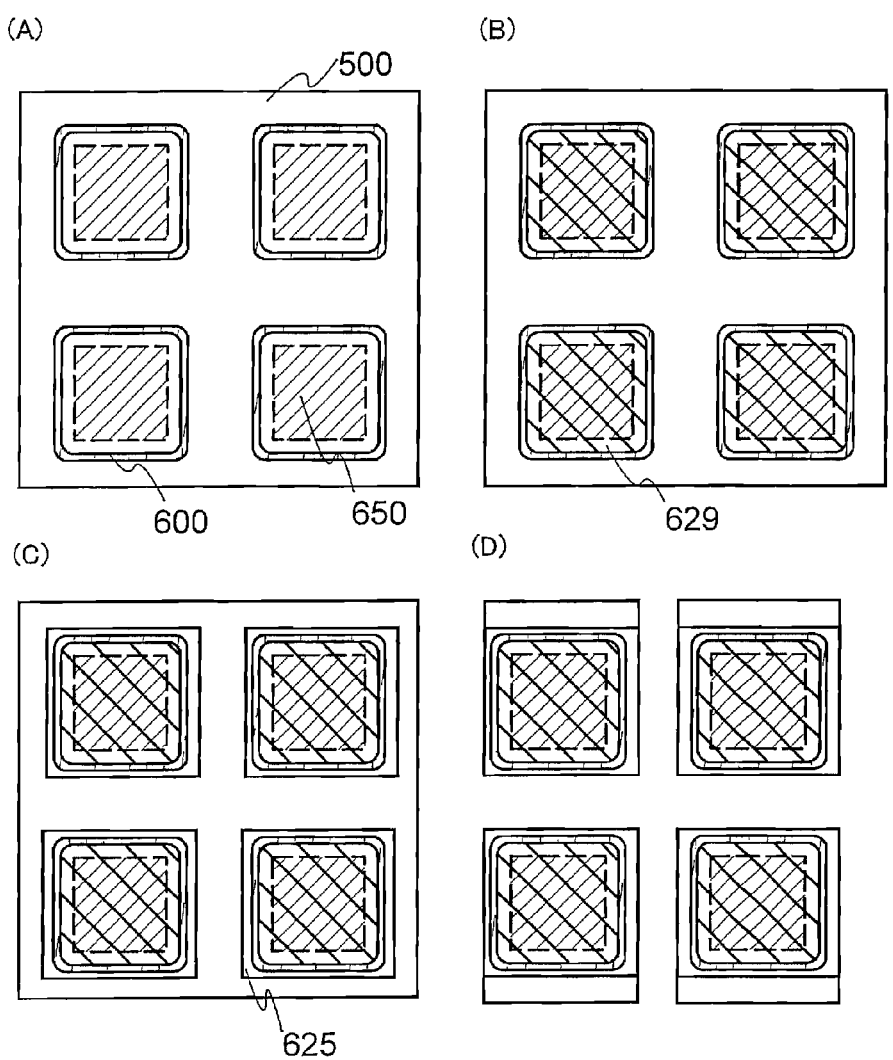

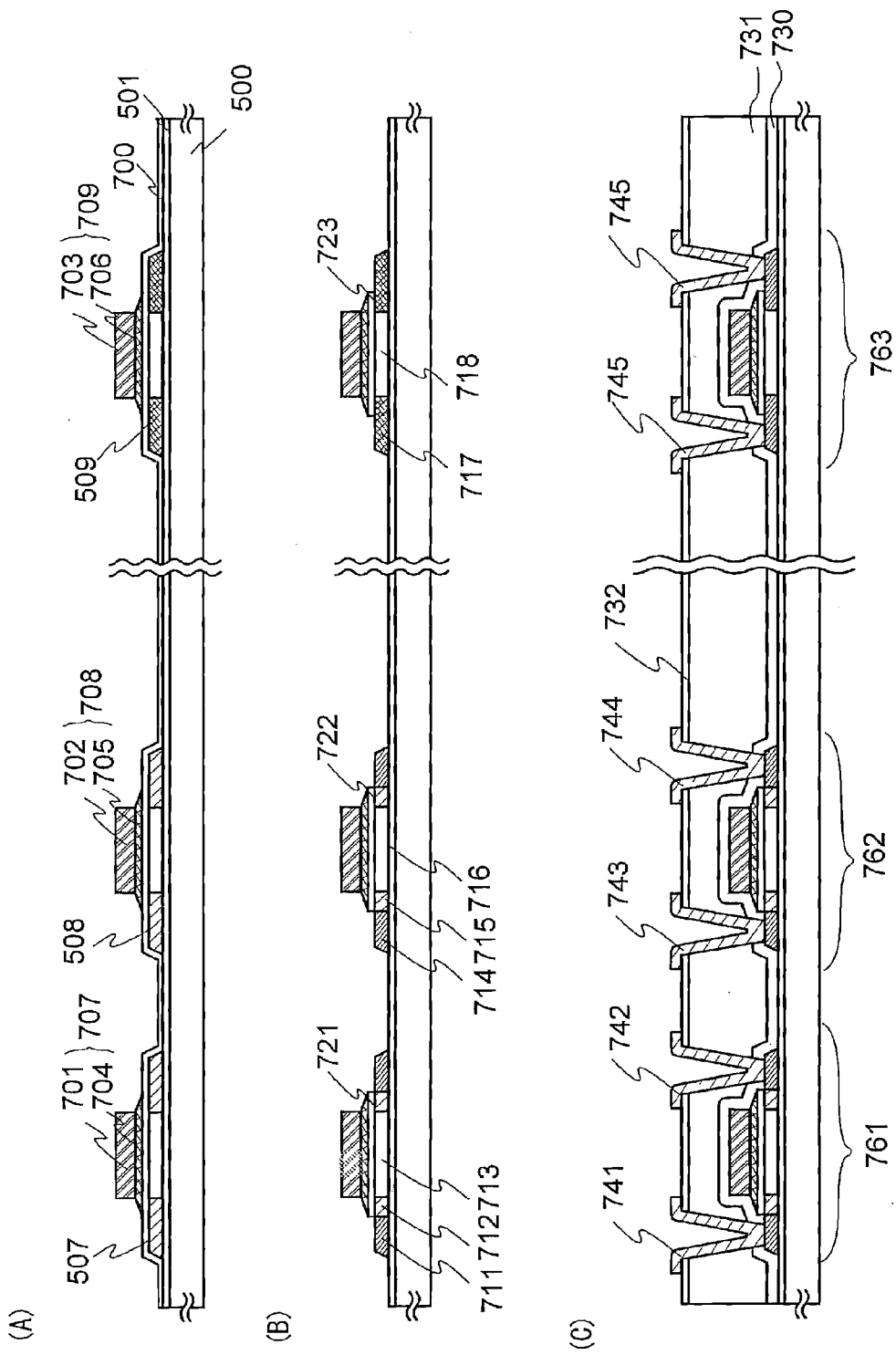

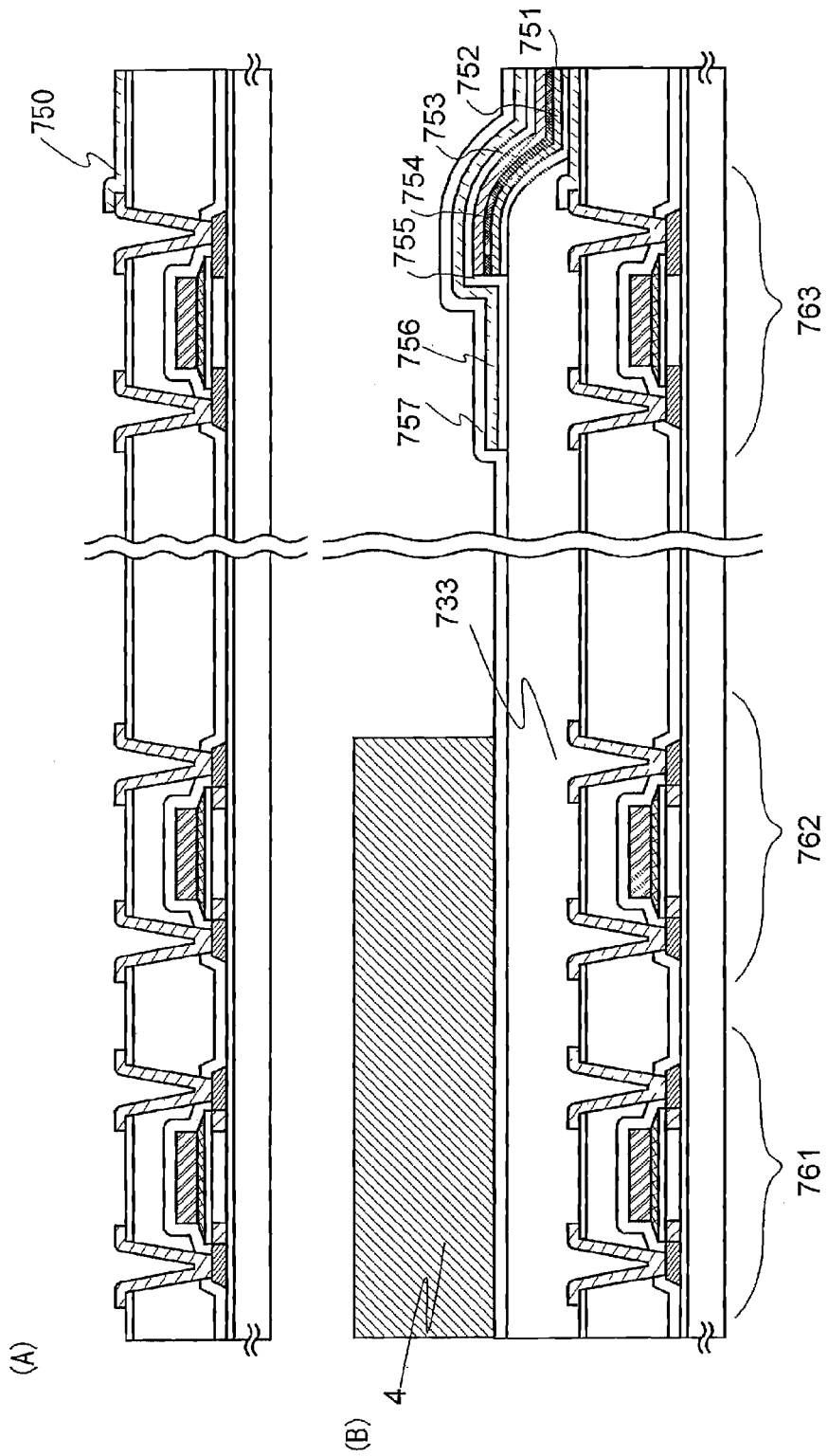
[FIG. 16]

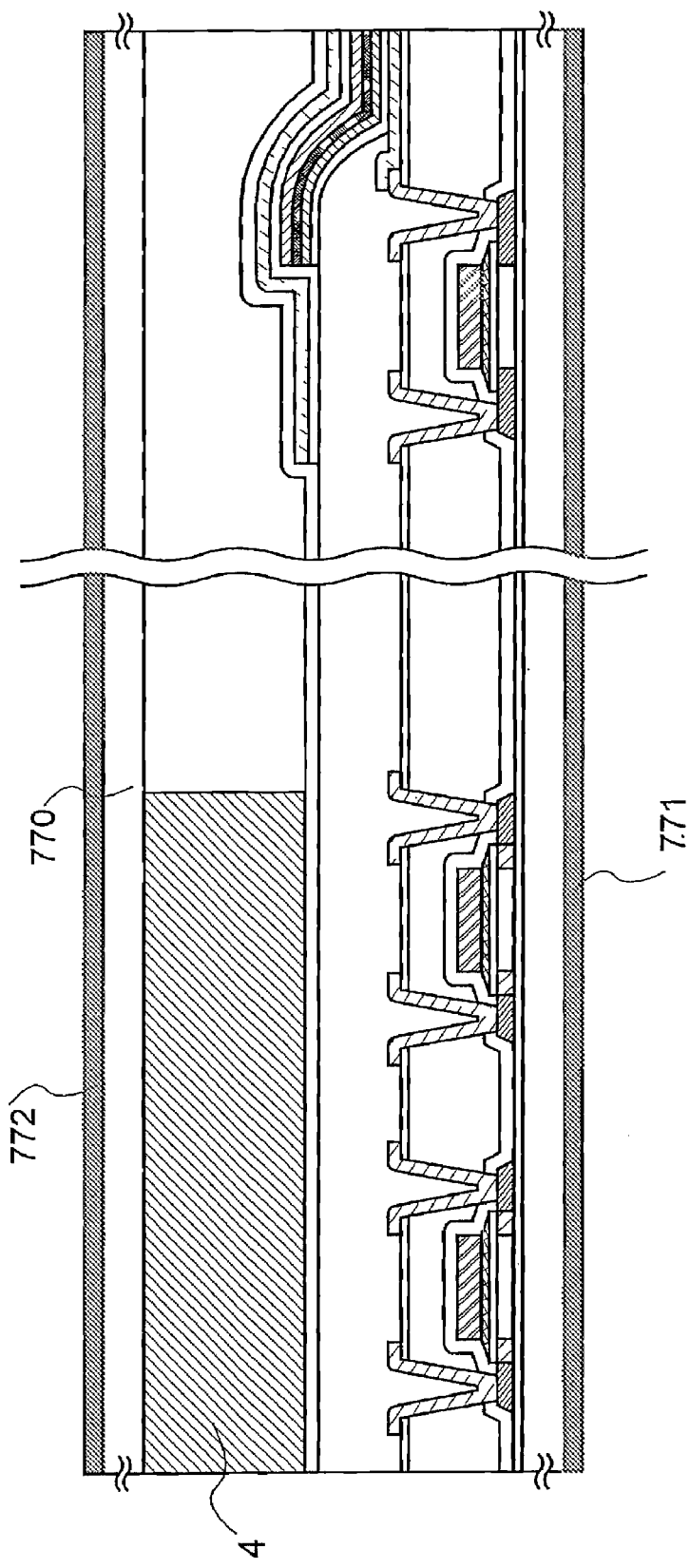
[FIG. 17]

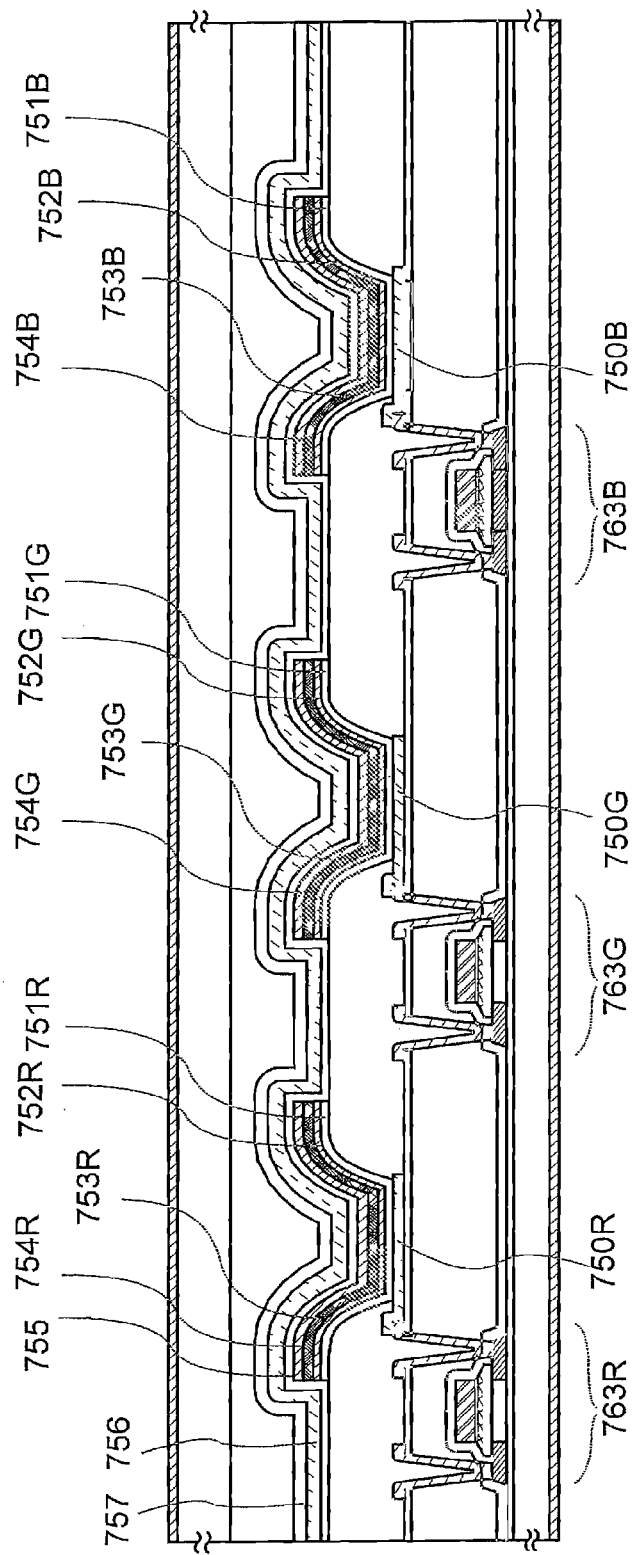

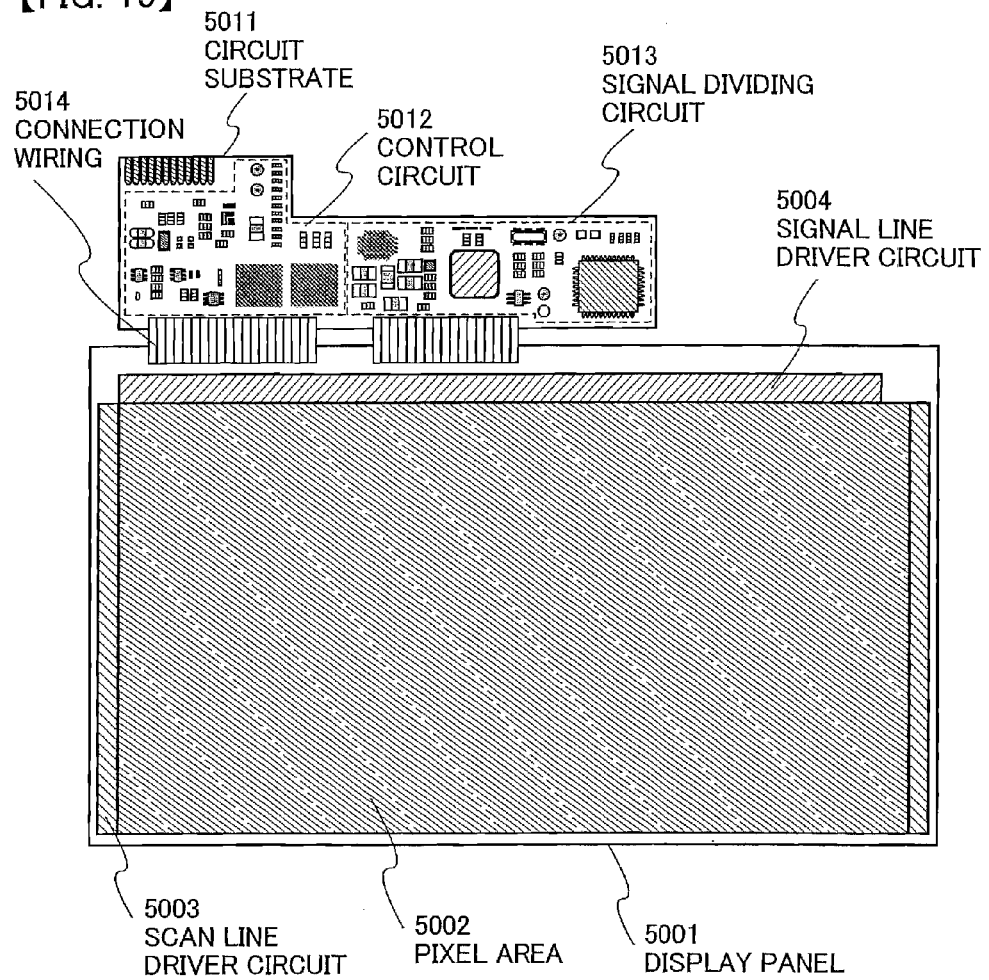

[FIG. 20]
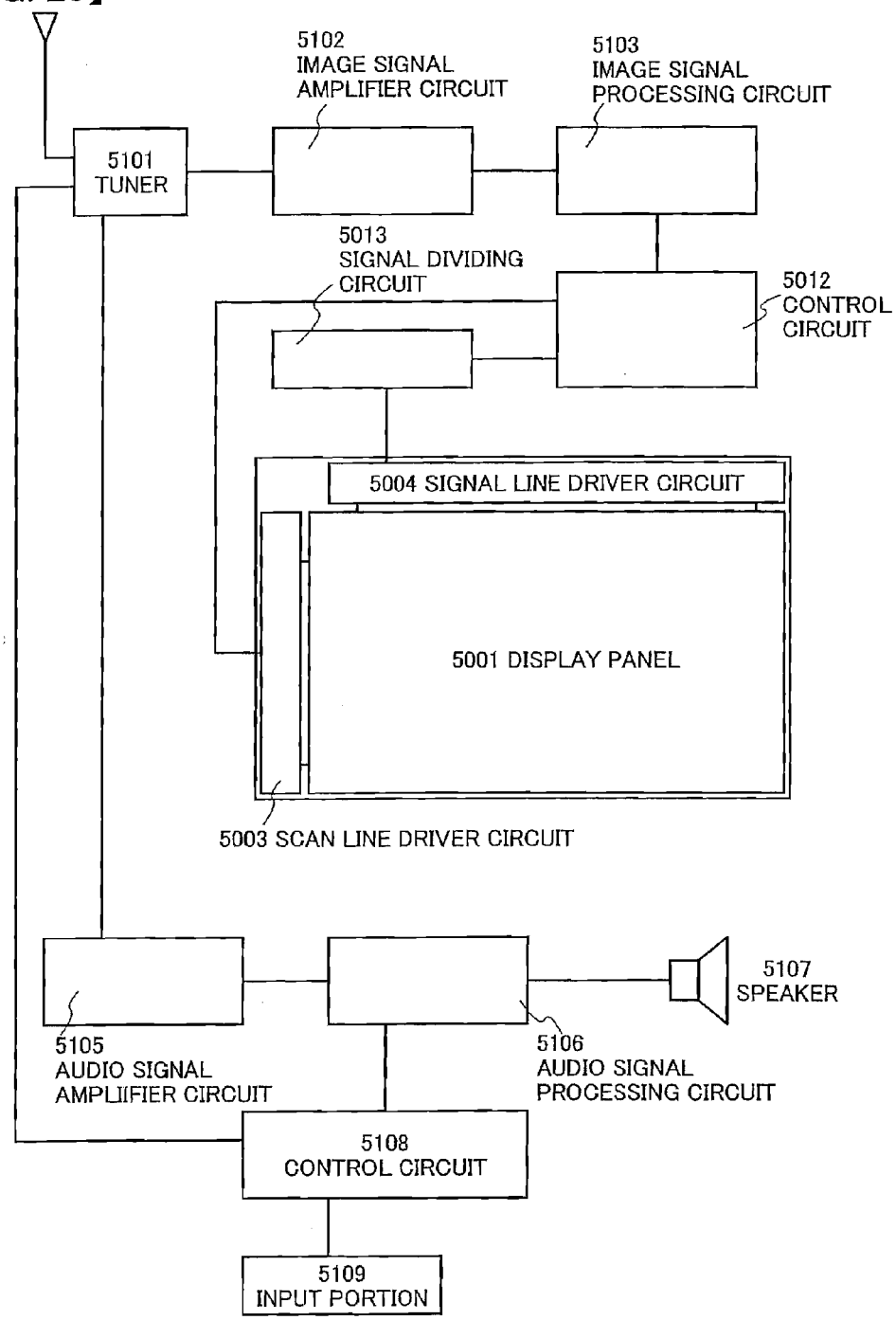

【FIG. 21】
(A)
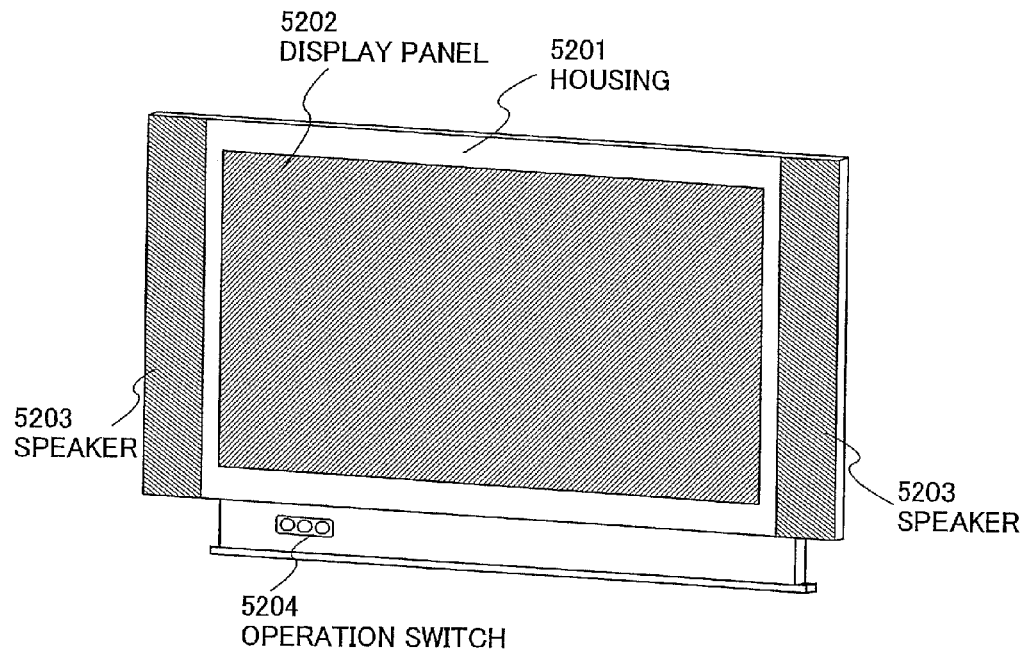
(B)
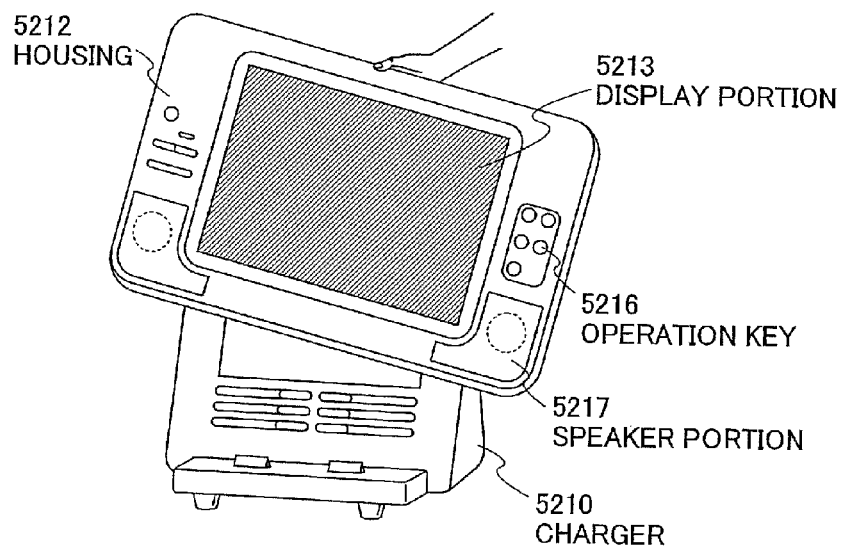

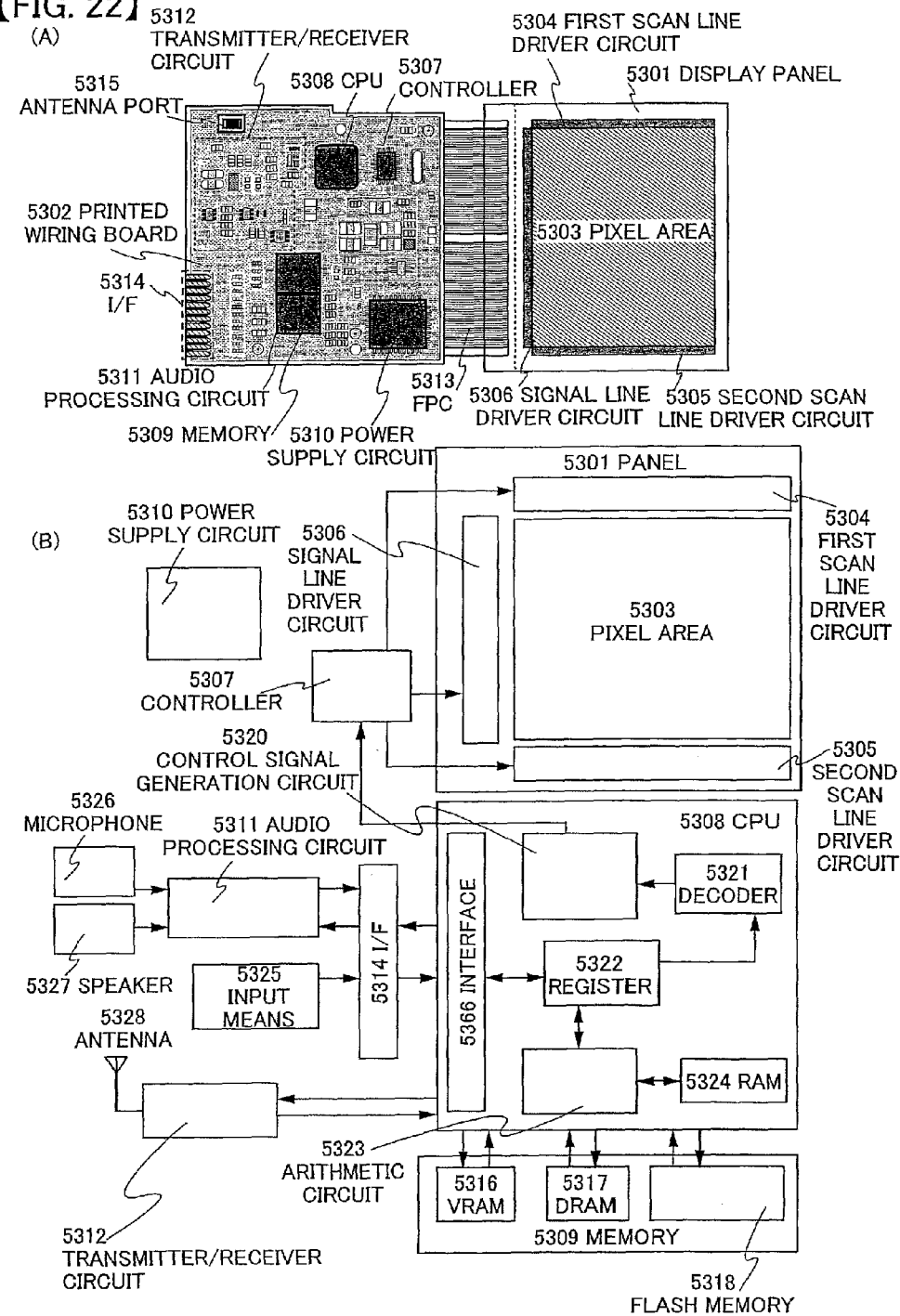

[FIG. 23]
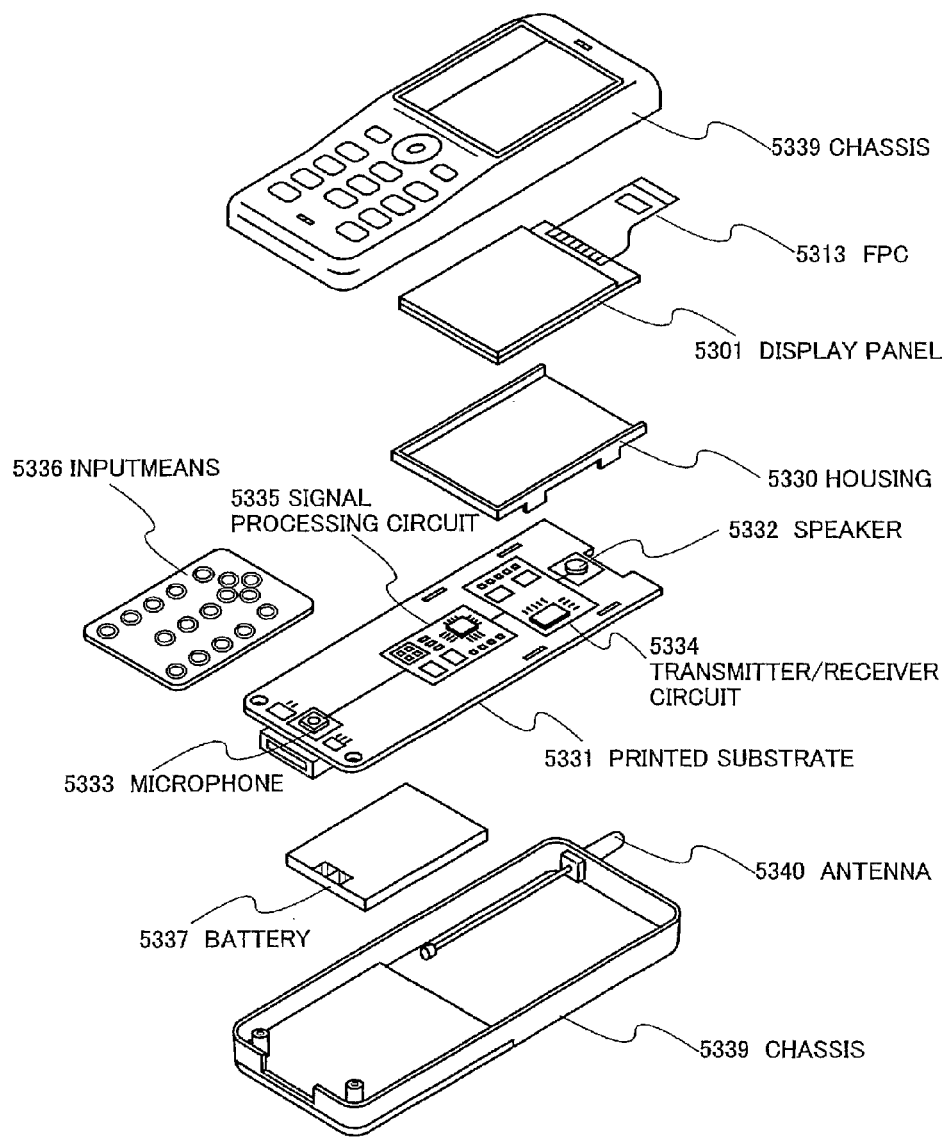

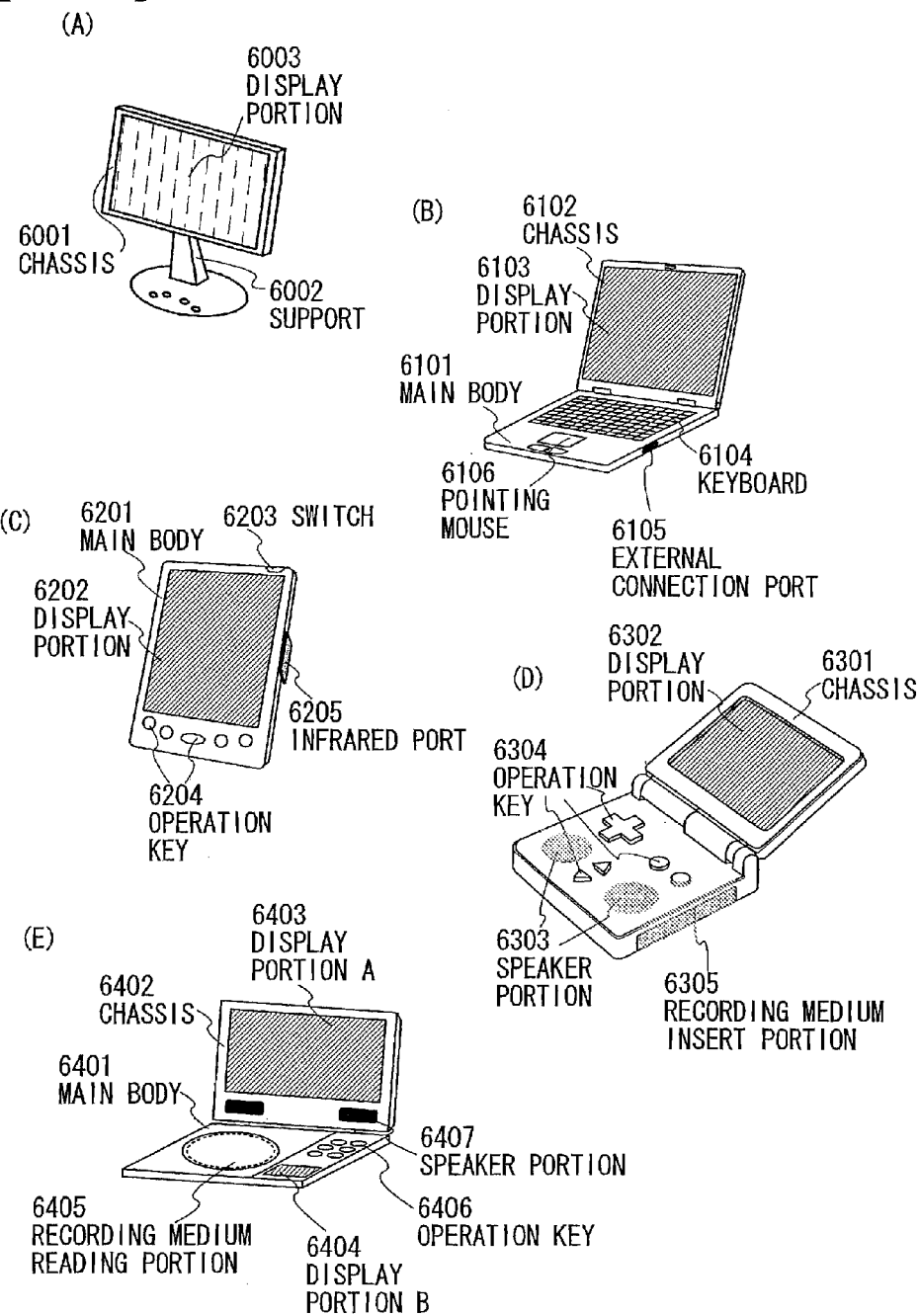

DISPLAY DEVICE

BACKGROUND OF THE INVENTION

The present invention relates to a display device in which an IC (Integrated Circuit) or the like is mounted by a method such as chip on glass (hereinafter referred to as COG). An IC is electrically connected to a glass substrate by aligning a solder bump formed on the IC to a terminal pad formed on the substrate, bringing them into contact with each other, and thereafter heating and melting the solder bump. Alternatively, the connection is made by what is called a wire bonding method, in which a terminal protruding from an IC and a terminal on the substrate are connected by a wire. Further, the present invention relates to a sealing structure of a display device in which an IC is mounted by using these methods.

DESCRIPTION OF RELATED ART

Lower power consumption, smaller size, lighter weight, more functions, and the like are required for a cellular phone, a PDA, a digital camera, and the like. Accordingly, as to a display mounted on a cellular phone, a PDA, or a digital camera, and the like; the cases where a driver IC is directly mounted on what is called a TFT substrate by a method such as COG (Chip On Glass) (for example, see Patent Document 1).

Patent Document 1
Japanese Patent No. 2553956

SUMMARY OF THE INVENTION

Problems to be Solved by the Invention

In the case where an IC is mounted on a substrate as a driver, since the driver IC itself has a certain height, the part mounted with a driver IC and the part without a driver IC necessarily has level difference over the substrate. FIG. 1 shows a cross-sectional view of a substrate in which a driver IC 103 is mounted on a substrate 101. Reference numeral 102 in the figure denotes a pixel region. A display element device has a structure in which a display element is held with 2 substrates; in attaching a substrate 101 and a counter substrate 106, the counter substrate is disposed to keep a uniform gap, and sealing is carried out by bonding using a sealing material. At this time, if the gap between the substrate 101 and the counter substrate 106 is not uniform, the counter substrate inclines as shown by the arrow in FIG. 5 and not disposed horizontally, so that sealing can not be carried out well. This also applies to a display device using a substrate on which a thin film transistor (TFT) is not formed (a passive display device).

In the case where the sealing of a display device is not adequate, it may be a factor of deterioration of a display element, which leads to reduction in the yield. In particular, since an organic EL element or the like is chemically unstable, it is deteriorated upon contact with oxygen or moisture. Accordingly, the sealing structure for preventing air or moisture from entering from the outside is important. Further, when an IC is arranged outside the seal region, a frame would be larger. Thus, there are also problems that a display region can not be made larger, a module can not be downsized, or the like.

Means to Solve the Problems

The present invention is for solving the problems, which is a structure in which a layer (spacer layer) for controlling a substrate gap is arranged in a panel for controlling a substrate gap. Specifically, a layer (spacer layer) for controlling a substrate gap, which has the same height as an IC, is provided over one substrate. Here, the height of an IC refers to the height between the substrate surface and the top face of the IC of the case where the IC is mounted on the substrate. Further, the height of the layer for controlling a substrate gap refers to the height between the substrate surface and the top face of the layer for controlling a substrate gap of the case where the layer for controlling a substrate gap is mounted on the substrate. Note that, in the present invention, the same height does not mean only exactly the same height. Specifically, the layer (spacer layer) for controlling a substrate gap may have almost the same height as an IC, and the height of the layer (spacer layer) for controlling a substrate gap preferably has a height in the range of ±0.3 mm as compared with the height of the IC. Further, in the case of providing an IC or a layer for controlling a substrate gap at the seal region using a sealing material or the like, the height of the sealing material or the like is required to be taken into consideration. In this case, an IC, a sealing material, and the like are inclusively referred to as a material layer including an IC, and a layer for controlling a substrate gap, a sealing material, and the like are inclusively referred to as a material layer simply. The height of the material layer is preferably in the range of ±0.3 mm as compared with the height of the material layer including the IC. With such a structure, the counter substrate can be arranged without inclination; thus, adequate sealing can be conducted. Consequently, it contributes to improvements in durability and reliability of the display element and extending the life.

When a driver IC is mounted on a seal region of the display device, what is called a (narrow frame) panel having a frame which is narrow, can be formed, and the protection of the IC by the sealing material can also be expected. The IC itself is packaged; however, when packaged, the size of the IC becomes larger than the size of only an IC chip. Since an IC which is mounted by a COG method or the like is required to be smaller, in the case where a packageless IC is mounted in the future, the sealing material can function to protect an IC chip by arranging an IC in the seal region. In this case, the seal region is preferably formed so that the sealing material or the like covers the IC. When at least the width of the seal region including the sealing material is longer than at least the width of the IC; thus, a side face of the IC is covered with the sealing material, so that the IC can be protected (FIG. 2(B)). The width of the IC may be any as long as it is shorter than the width of the seal region, for example, 2 mm to 3 mm, 1 mm to 2.5 mm as an alternative, or 0.5 mm to 1.5 mm as another alternative. Thus, the structure can be applied to ICs having various widths. Naturally, the seal region may be formed to protect the top and bottom surfaces of the IC.

The layer for controlling a substrate gap (spacer layer) or the material layer is also desirably arranged in the seal region of the panel. Generally, a display device is sealed on the four sides of the panel, so that when the layer for controlling a substrate gap (spacer layer) or the material layer is arranged in the seal region, the effect of the present invention can be fully exerted. FIG. 2 shows a cross-sectional view of a panel according to the invention in which a substrate 1 and a counter substrate 6 are attached. A layer for controlling a substrate gap (spacer layer) 4 having almost the same height as an IC 3 is disposed to sandwich a pixel region 2. A seal region is formed using a sealing material 7 at the periphery or sides of a panel provided with the IC 3 and the layer for controlling a substrate gap (spacer layer) 4. As shown in FIG. 2(A), in the case of using the sealing material 7, it is required not only that the heights of the IC 3 and the layer for controlling substrate gap (spacer layer) 4 are almost the same, but also that the height including the heights of the sealing material are controlled to be the same. Specifically, the height including the heights of the layer for controlling a substrate gap (spacer layer) 4 and the sealing material (that is, the height of the material layer), is preferably in the range of ±0.3 mm of the height including the IC and the sealing material (that is, the height of the material layer including the height of the IC). Further, the IC is not limited to a common driver IC, and may have other functions.

EFFECT OF THE INVENTION

As explained above in details, in a display device in which a driver IC is mounted on and connected to a substrate by a COG method or the like, the level difference can be controlled by arranging a layer for controlling a substrate gap (spacer layer) or a material layer over a substrate; thus, a counter substrate can be arranged without inclination. Accordingly, sealing can be carried out with high accuracy. Consequently, a highly durable and reliable display element having a long life can be obtained by preventing air or moisture from entering. Further, when the driver IC is mounted on a seal region of the display device, a (narrow frame) panel having a narrow frame can be formed. In addition, the driver IC can be protected with a sealing material or the like.

BRIEF DESCRIPTION OF THE DRAWINGS

FIG. 1 is a cross-sectional view of a TFT substrate on which an IC is mounted.

FIGS. 2A-2B are cross-sectional views of TFT substrates in each of which a layer for controlling a substrate gap is disposed over a driver.

FIG. 3 is a structural drawing of a TFT substrate in which a substrate gap a layer for controlling a substrate gap is disposed to surround a seal region.

FIG. 4 is a structural drawing of a panel in which a TFT substrate on which an IC is mounted and a counter substrate are attached.

FIG. 5 is a cross-sectional view of a panel in which a counter substrate is disposed over a TFT substrate in which level difference is caused.

FIG. 6 is a structural drawing in which a chip capacitor is disposed on a wiring.

FIGS. 7A-7B are structural drawing of a TFT substrate in which a layer for controlling a substrate gap is disposed in a corner of a panel.

FIGS. 8A-8D are figures explaining steps for manufacturing a TFT.

FIGS. 9A-9C are figures explaining steps for manufacturing a TFT.

FIGS. 10A-10C are figures explaining steps for manufacturing a TFT.

FIG. 11 is a figure explaining a step for manufacturing a liquid crystal display device.

FIG. 12 is a figure explaining a step for manufacturing a liquid crystal display device.

FIG. 13 is a figure explaining a step for manufacturing a liquid crystal display device.

FIGS. 14A-14D are figures explaining steps for manufacturing a liquid crystal display device.

FIGS. 15A-15C are figures explaining steps for manufacturing an EL display device.

FIGS. 16A-16B are figures explaining steps for manufacturing an EL display device.

FIG. 17 is a figure explaining a step for manufacturing an EL display device.

FIG. 18 is a figure explaining a step for manufacturing an EL display device.

FIG. 19 is a figure showing an example of an electronic device to which the present invention is applied.

FIG. 20 is a figure showing an example of an electronic device to which the present invention is applied.

FIGS. 21A-21B are figures each showing an example of an electronic device to which the present invention is applied.

FIGS. 22A-22B are figures each showing an example of an electronic device to which the present invention is applied.

FIG. 23 is a figure showing an example of an electronic device to which the present invention is applied.

FIGS. 24A-24E are figures each showing an example of an electronic device to which the present invention is applied.

DETAILED DESCRIPTION OF THE INVENTION

Best Mode for Carrying Out the Invention

Embodiment Mode 1

An embodiment mode of the invention will be described with reference to FIGS. 2 to FIG. 4 and other drawings. First, in the case of connecting or mounting an IC 3 by a COG method, a glass substrate is generally used for a substrate 1. However, in the present invention, not only a glass substrate, but also a plastic substrate, a Si wafer, or the like can be applied to the substrate 1. Note that, in the case of connecting the IC 3 directly to an electrode terminal over a plastic substrate, a COP method (Chip On Plastic) is used. In the present invention, a layer for controlling a substrate gap (spacer layer) 4 can be provided over the substrate 1 irrespective of the material of the substrate 1.

Next, IC 3 will be described. The IC 3 may be a versatile one. The IC package is desirably small to be easily mounted. Alternatively, an IC chip may be used alone. The substrate 1 and the IC 3 are electrically connected by aligning a solder bump formed on the IC to a terminal pad formed on the substrate, bringing them into contact with each other, and thereafter heating and melting the solder bump. Alternatively, the connection is made by what is called a wire bonding method, in which a terminal protruding from an IC and a terminal on the substrate are connected with a wire. As to a location to arrange the IC 3, when the IC 3 is disposed in a seal region of a panel, a (narrow frame) panel having a narrow frame can be formed, and the sealing material 7 can function to protect the IC.

The layer for controlling a substrate gap (spacer layer) 4 may be anything as long as it can control the level difference, so that a counter substrate 6 can be arranged without inclination. For example, glass, a plastic film, a metal film, a Si substrate, an IC, or the like may be used. Further, the layer may be deposited and formed by CVD, spin coating, or the like. In this case, an insulating film such as a silicon oxide film, a silicon nitride film; a metal film; or a semiconductor film can be formed.

The layer for controlling a substrate gap (spacer layer) 4 desirably has the same height as the level difference caused over the substrate 1 in mounting the IC 3. Even a same IC as the IC 3 can be formed if cost is not considered. Further, the layer for controlling a substrate gap (spacer layer) 4 may have almost the same height as the IC. The height of the layer for controlling a substrate gap (spacer layer) 4 is preferably in the range of ±0.3 mm as compared with the height of the IC 3. In addition, the layer for controlling a substrate gap (spacer layer) may further preferably has a height in the range of ±0.05 mm as compared with the height of the IC 3.

The layer for controlling a substrate gap (spacer layer) 4 may have an electrical function other than controlling the level difference. In that case, the layer for controlling a substrate gap (spacer layer) 4 may have a lower height than the IC. As shown in FIG. 6, a chip capacitor (also referred to as a monolithic capacitor) 9 serving as a storage capacitor of a power supply may be arranged on a wiring 10 connected to a connection terminal 11. The chip capacitor 9 serves as a layer for controlling level difference and at the same time as a storage capacitor for stabilizing the power supply. For example, in the case where the chip capacitor 9 is arranged through a power line Vdd and a power line Vss, the chip capacitor 9 serves as a storage capacitor between the two wirings; thus, the power supply Vdd and the power supply Vss are expected to be stabilized. The height of the chip capacitor is generally 0.6 to 1.0 mm approximately, and the height of an IC which is given a package having a size of about the chip size, which is referred to as CSP (Chip Size Package or Chip Scale Package), is 1.0 mm or less. If a chip capacitor is selected in accordance with the height of the IC, the level difference can be reduced to within the range of ±0.1 mm with respect to the height of the IC. Note that, a chip resistor or the like may be used for such a layer for controlling a substrate gap (spacer layer) 4 having an electrical function.

The chip capacitor is provided between a voltage supply line and another wiring. The wiring is not limited in particular; for example, a special wiring may be provided, or another voltage supply line may be used without any particular limitation. A chip resistor may be provided between a signal line and a voltage supply line, or may be inserted serially in the signal line. In addition, a chip capacitor and a chip resistor may be used in combination.

A chip capacitor is desirably connected to a wiring which constantly supplies a certain potential, such as a power line (such as a Vdd line) or a ground line (a Vss line, a GND line). By arranging a chip capacitor on such a wiring which consumes much charge, when a circuit connected to the wiring comes to consume much current, current can be supplied quickly by using the charge stored in the capacitor. In other words, reduction in electric potential caused due to flow of much current can be prevented by using the charge stored in the capacitor. If there is no capacitor around the circuit, which consumes current, charge is required to be supplied from a remote location. Then, the electric potential of the wiring is reduced due to wiring resistance. Consequently, malfunction of the circuit is caused. In view of the above problems, the chip capacitor is arranged near the circuit which consumes current, namely, over the glass substrate; thus, reduction in the electric potential or malfunction of the circuit can be prevented.

In the case of connecting the chip capacitor to the wiring, a wiring dedicated for connecting the chip capacitor is arranged. The chip capacitor may be connected between the wiring and another wiring which constantly supplies a certain potential, such as a power line (such as a Vdd line) or a ground line (a Vss line, a GND line). However, in that case, since a special wiring is required, the chip capacitor is desirably connected between wirings such as a power line (such as a Vdd line) and a ground line (a Vss line, a GND line), and each of which constantly supplies a certain potential. Thus, the number of wirings can be reduced. Further, in the case of connecting the chip capacitor between wirings, the chip capacitor is desirably arranged between a wiring having higher potential (high potential power line) and a wiring having lower potential (low potential power line). This is because more charge can be stored by connecting the chip capacitor between wirings having high potential difference.

Note that, in an area where voltage is applied from the external to a pixel region or a driver circuit area, which is integrated on a substrate, the chip capacitor is desirably connected between wirings each of which constantly supplies a certain potential. Thus, in the pixel region or the driver circuit area, malfunction due to drop in voltage can be reduced. Further, in an area where voltage is supplied from the outside to an external IC attached by COG or the like, a chip capacitor is desirably connected between wirings which constantly supply a fixed electric potential to the external IC. Thus, change in the voltage supplied to the external IC can be reduced, and malfunction can be reduced.

Further, in an area where voltage is supplied from an external IC attached by COG or the like to a pixel region or a driver circuit area integrated on the substrate, a chip capacitor is desirably connected between wirings which constantly supply a certain electric potential (namely, between wirings outputted from the external IC). Thus, in the pixel region or the driver circuit area, malfunction due to drop in voltage can be reduced. A chip capacitor may be disposed between a wiring for supplying voltage to a pixel region or a driver circuit area from outside, a wiring for supplying voltage to an external IC attached by COG or the like, a wiring for supplying voltage from an external IC attached by COG or the like to a pixel region or a driver circuit area, or the like; alternatively, the chip capacitor may be disposed between each of the wirings.

Further, a chip capacitor may be used in a charge pump circuit. Note that the example shown here is only an example, and the usage of a chip capacitor is not limited thereto.

A chip resistor may be used as a pull-up resistor or a pull-down resistor. In other words, when a resistor is arranged between a signal line inputted to an external IC attached by COG or the like and a power line inputted to an external IC attached by COG or the like, the potential of the power line can travel to the signal line through the resistor even in the case where amplitude of the input signal is not large enough; thus, the amplitude of the input signal becomes substantially large so that the external IC can operate more easily. In that case, malfunction of a circuit for inputting an input signal to the external IC can be reduced by arranging the chip resistor around an input terminal of the external IC. Alternatively, the chip resistor may be disposed to connect serially between a signal line inputted to an external IC attached by COG or the like, and an input terminal of the external IC. Thus, in the case where static electricity enters the external IC, the energy of the static electricity is attenuated due to the resistor, so that the external IC can be protected.

Further, in order to reduce effect of static electricity, the chip resistor and the chip capacitor may be provided in combination. In that case, since delay due to RC is caused, even in the case where an impulse signal caused by static electricity or the like enters, the signal can be made dull; accordingly, the effect of the static electricity can be reduced, and the element can be protected. Note that, even in the case where a chip resistor is used for reducing static electricity, or used as a pull-up resistor or a pull-down resistor; it is used without limitation to an area where input to an external IC attached by COG or the like is carried out. The chip resistor may be disposed in an area where output to an external IC attached by COG or the like is carried out or an area where it is supplied to a pixel region or a driver circuit area which is integrated on the substrate. Also in this case, the effect similar to the case of the external IC can be obtained. Accordingly, by arranging a chip resistor over a glass substrate, an external IC or a circuit which inputs a signal to the external IC, or a pixel region or a driver circuit area which is integrated on the substrate comes to operate more easily, and effect of static electricity can be reduced. Note that the example shown here is only an example, and the usage of a chip resistor is not limited thereto.

In the case where a TFT is manufactured over a substrate, and a driver circuit and/or a driver are/is formed using the TFT, a layer for controlling a substrate gap (spacer layer) or a material layer can be disposed over the driver, the driver. In an active matrix display device, a signal is supplied from a signal line driver circuit, scanning is performed from a scan line driver circuit to have each pixel store an external signal. For example, in the case where a high power consuming signal line driver circuit is mounted using an IC, a layer for controlling a substrate gap (spacer layer) or a material layer can be disposed over a scan line driver circuit formed over the TFT substrate.

Needless to say, the present invention can also be applied to a display device in which a TFT is not formed over a substrate, namely, a passive display device.

In the case where the IC 3 is provided on one side of the substrate 1, the layer for controlling a substrate gap (spacer layer) 4 is necessarily formed on at least one side of the substrate. When the IC 3 is arranged on one side, the layer for controlling a substrate gap (spacer layer) 4 is arranged opposite to the IC 3 with the pixel region 2 therebetween. FIG. 3 shows a structural view in which the layer for controlling a substrate gap (spacer layer) 4 is disposed over a scan line driver circuit 5 formed over each end of the substrate 1 sandwiching the pixel region 2, and the layer for controlling a substrate gap (spacer layer) 4 is further disposed opposite to the IC 3 with the pixel region 2 therebetween. As shown in FIG. 4, the layer for controlling substrate gap (spacer layer) 4 may be arranged so as to surround the periphery of the panel that is a seal region of the display device. In this case, the counter substrate 6 can be arranged more stably than the arrangement example of FIG. 3, and junction property with the substrate 1 is increased. In addition, the layer for controlling a substrate gap (spacer layer) 4 may be formed on each corner of the substrate 1 (FIG. 7(A)). It may be arranged not on all the corners but on two corners on one side opposite to the IC 3 with the pixel region 2 therebetween (FIG. 7(B)).

The display device is sealed by attaching the substrate 1 and the counter substrate 6 with the sealing material 7. In the case of disposing a layer for controlling substrate gap (spacer layer) in a seal region, a planarization film may be provided all over the substrate or over the seal region before forming the sealing material. With the planarization film, the junction property between the substrate 1 and the counter substrate 6 is further increased. The planarization film may be an organic film or an inorganic film.

The sealing material 7 can be formed by a coating method using a dispenser or the like, screen printing, or the like. The sealing material used may be a thermosetting one, thermoplastic one, or a UV curable one. Further, space 8 between the substrate 1 and the counter substrate 6, which is formed other than in the pixel region or the seal region, may be filled with the sealing material Liquid crystals, organic EL, or electronic paper may be used for the display mode. The present invention does not limit the display mode.

An adhesive is used for attaching the layer for controlling a substrate gap (spacer layer) 4. In the case where a layer for controlling a substrate gap (spacer layer) having an electrical function is used, and the place to dispose it is not on a driver or a wiring, as with the case of mounting an IC, the attachment may be carried out by heating and melting solder which is previously attached to the layer for controlling a substrate gap (spacer layer) while the layer for controlling substrate gap (spacer layer) 4 is disposed on a terminal pad formed over the substrate 1. In the case where a capacitor, for example, a chip capacitor or the like, which has an electrical function is used as the layer for controlling a substrate gap (spacer layer), a wiring is necessarily connected in addition to the attachment. Depending on the place to dispose the layer for controlling substrate gap (spacer layer) 4 or the properties of the layer for controlling substrate gap (spacer layer) 4, an insulating layer is necessarily provided at the attachment portion. In particular, in arranging the layer for controlling substrate gap (spacer layer) 4 on a driver or a wiring, a conductor can not be simply attached. Accordingly, an insulating film or the like is necessarily formed between the TFT substrate and the layer for controlling a substrate gap (spacer layer) 4. There is a case where an adhesive serves as the insulating film when a highly insulative adhesive is used. However, in the case where the layer for controlling substrate gap (spacer layer) 4 has an electrical function, and is not required to be insulated in contrast; a conductive resin material or the like is used as the adhesive.

As to a process for forming the layer for controlling a substrate gap (spacer layer) 4 and the IC 3, they can be formed concurrently, the layer for controlling substrate gap (spacer layer) 4 can be formed after forming the IC 3, or the IC 3 can be formed after forming the layer for controlling substrate gap (spacer layer) 4. Then, the sealing material is formed after forming the layer for controlling substrate gap (spacer layer) 4 and the IC 3.

A glass substrate, a plastic substrate, a Si wafer, or the like can be applied to the counter substrate 6. However, since the present invention is applied to a display device, at least one of the substrate 1 and the counter substrate 6 is required to transmit light. Further, in the present invention, the substrate 1 and the counter substrate 6 preferably have the same shape. Thus, not only the pixel region but also the IC 3 can be protected by the sealing material and the counter substrate 6.

Finally, after the IC 3, the layer for controlling a substrate gap (spacer layer) 4, the sealing material 7 are formed over the substrate 1 in the above manner, the counter substrate 6 is attached thereto.

Embodiment Mode 2

A method of manufacturing a thin film transistor formed in a pixel region or a peripheral driver circuit area in the case where the present invention is applied to an active matrix display device will be explained with reference to FIGS. 8, 9, and 10. Note that, this embodiment mode will explain the case of using a crystalline semiconductor film; however, an amorphous semiconductor film or a single crystal semiconductor film may be used instead.

First, as shown in FIG. 8(A), a base film 501 is formed over a substrate 500. A glass substrate, for example, barium borosilicate glass or aluminoborosilicate glass, a quartz substrate, a stainless steel substrate, or the like can be used as the substrate 500. In addition, a substrate formed from a flexible synthetic resin such as acrylic or plastic, typified by PET, PES, and PEN can be used.

The base film 501 is provided so as to prevent an alkali metal such as Na or an alkaline earth metal which is included in the substrate 500 from diffusing into a semiconductor film and adversely affecting characteristics of a semiconductor element. Therefore, an insulating film of silicon nitride, silicon oxide containing nitrogen, or the like which can suppress the diffusion of the alkali metal or alkaline earth metal into the semiconductor film is used. In this embodiment mode, a silicon oxide film containing nitrogen is formed to a thickness of 10 nm to 400 nm (preferably, 50 nm to 300 nm) by plasma CVD.

Next, a semiconductor film 502 is formed over the base film 501. The film thickness of the semiconductor film 502 is 25 nm to 100 nm (preferably, 30 nm to 60 nm). The semiconductor film 502 may be an amorphous semiconductor or a polycrystalline semiconductor. As the semiconductor, not only silicon (Si) but also silicon germanium (SiGe) may be used. In the case of using silicon germanium, the concentration of germanium is preferably about 0.01 to 4.5 atomic%.

Next, as shown in FIG. 8(B), the semiconductor film 502 is crystallized by being irradiated with a linear laser 499. In the case of conducting the laser crystallization, the semiconductor film 502 may be heat treated at 500° C. for one hour before the laser crystallization in order to increase resistance of the semiconductor film 502 against the laser.

In the laser crystallization, a continuous wave laser or a pulsed laser having a repetition rate of 10 MHz or more, preferably, 80 MHz or more, as a quasi-CW (Continuous-Wave) laser can be used.

Specifically, as the continuous wave laser, an Ar laser, a Kr laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a helium-cadmium laser, or the like is given.

A pulsed laser such as an Ar laser, a Kr laser, an excimer laser, a $CO_2$ laser, a YAG laser, a $YVO_4$ laser, a YLF laser, a $YAlO_3$ laser, a $GdVO_4$ laser, a $Y_2O_3$ laser, a ruby laser, an alexandrite laser, a Ti:sapphire laser, a copper vapor laser, or a gold vapor laser can be used as the quasi-CW laser as long as pulse oscillation at a repetition rate of 10 MHz or more, preferably 80 MHz or more is possible.

Such a pulsed laser eventually shows a similar effect to that of a continuous wave laser while the repetition rate is increased.

For example, in the case of using a solid-state laser capable of continuous wave oscillation, a crystal having large grain size can be obtained by irradiation with laser light of second to fourth harmonics. Typically, it is desirable to use the second harmonic (532 nm) or the third harmonic (355 nm) of a YAG laser (the fundamental wave 1064 nm). For example, laser light emitted from a continuous wave YAG laser is introduced into a harmonic with a non-linear optical element to irradiate the semiconductor film 502. The power density may be approximately in the range of 0.01 $MW/cm^2$ to 100 $MW/cm^2$ (preferably 0.1 $MW/cm^2$ to 10 $MW/cm^2$).

By irradiating the semiconductor film 502 with the laser light as described above, a crystalline semiconductor film 504 of which crystallinity has been enhanced is formed.

Then, as shown in FIG. 8(C), the crystalline semiconductor film 504 is selectively etched to form island-shaped semiconductor films 507 to 509.

Next, an impurity is introduced into the island-shaped semiconductor films in order to control a threshold value. In this embodiment mode, boron (B) is introduced into the island-shaped semiconductor films by doping with diborane ($B_2H_6$).

Next, an insulating film 510 is formed so as to cover the island-shaped semiconductor films 507 to 509. As the insulating film 510, for example, silicon oxide (SiO), silicon nitride (SiN), silicon oxide containing nitrogen ($SiO_xN_y$: x>y>0), or the like can be used. As the film formation method, plasma CVD, sputtering, or the like can be used.

Next, after a conductive film is formed over the insulating film 510, the conductive film is selectively etched to form gate electrodes 570 to 572.

The gate electrodes 570 to 572 are formed with a single layer of a conductive film or with a structure in which two or more conductive films are stacked. In the case of stacking the two or more conductive films, the gate electrodes 570 to 572 may be formed by stacking an element selected from tantalum (Ta), tungsten (W), titanium (Ti), molybdenum (Mo), or aluminum (Al), or an alloy material or a compound material containing the above element as its main component. Alternatively, the gate electrodes may be formed using a semiconductor film typified by a polycrystalline silicon film doped with an impurity element such as phosphorus (P).

In this embodiment mode, the gate electrodes 570 to 572 are formed as described below. For example, a tantalum nitride (TaN) film is formed to a thickness of 10 nm to 50 nm, for example 30 nm, as a first conductive film 511. Then, for example, a tungsten (W) film is formed over the first conductive film 511 to a thickness of 200 nm to 400 nm, for example, 370 nm, as a second conductive film 512 to form a layered film of the first conductive film 511 and the second conductive film 512 (FIG. 8D).

Subsequently, the second conductive film 512 is etched by anisotropic etching to form upper layer gate electrodes 560 to 562 (FIG. 9(A)). Then, the first conductive film 511 is etched by isotropic etching to form lower layer gate electrodes 563 to 565 (FIG. 9B). Thus, the gate electrodes 570 to 572 are formed.

The gate electrodes 570 to 572 may be formed as a part of a gate wiring, or the gate electrodes 570 to 572 may be connected to a gate wiring which is formed separately.

Then, each of the island-shaped semiconductor films 507 to 509 is doped with an impurity which imparts one conductivity (n-type or p-type conductivity) using the gate electrodes 570 to 572 or a selectively formed resist as a mask, so that a source region, a drain region, a low-concentration impurity region, and the like are formed.

First, phosphorus (P) is introduced into the island-shaped semiconductor films at an acceleration voltage of 60 keV to 120 keV and with a dose of $1\times10^{13}$ $cm^{-2}$ to $1\times10^{15}$ $cm^{-2}$ using phosphine ($PH_3$). At this introduction of the impurity, channel-forming regions 522 and 527 of n-channel TFTs 550 and 552 are formed.

In order to manufacture a p-channel TFT 551, boron (B) is introduced into the island-shaped semiconductor films using diborane ($B_2H_6$) under the conditions: an applied voltage of 60 keV to 100 keV, for example 80 keV, and dose of $1\times10^{13}$ $cm^{-2}$ to $5\times10^{15}$ $cm^{-2}$, for example $3\times10^{15}$ $cm^{-2}$. Thus, a source region or drain region 523 of the p-channel TFT is formed, and a channel-forming region 524 is formed in this introduction of the impurity (FIG. 9C).

Next, the insulating film 510 is selectively etched to form gate insulating films 580 to 582.

After forming the gate insulating films 580 to 582, phosphorus (P) is introduced into the island-shaped semiconductor films to be the n-channel TFTs 550 and 552 at an applied voltage of 40 keV to 80 keV, for example 50 keV, and with a dose of $1.0\times10^{15}$ $cm^{-2}$ to $2.5\times10^{16}$ $cm^{-2}$, for example $3.0\times10^{15}$ $cm^{-2}$, using phosphine ($PH_3$). Accordingly, low-concentration impurity regions 521 and 526 of the n-channel TFT and source regions or drain regions 520 and 525 are formed (FIG. 10(A)).

In this embodiment mode, phosphorus (P) is contained in each of the source regions or drain regions 520 and 525 of the n-channel TFTs 550 and 552 at a concentration of $1\times10^{19}$ $cm^{-3}$ to $5\times10^{21}$ $cm^{-3}$. Moreover, phosphorus (P) is contained in each of the low-concentration impurity regions 521 and 526 of the n-channel TFTs 550 and 552 at a concentration of $1\times10^{18}$ $cm^{-3}$ to $5\times10^{19}$ $cm^{-3}$. Further, boron (B) is included in the source or drain region 523 of the p-channel TFT 551 at a concentration of $1\times10^{19}$ cm$^{-3}$ to $5\times10^{21}$ cm$^{-3}$.

Next, a first interlayer insulating film 530 is formed covering the island-shaped semiconductor films 507 to 509 and the gate electrodes 570 to 572 (FIG. 10B).

As the first interlayer insulating film 530, an insulating film containing silicon, for example, a silicon oxide film (SiO), a silicon nitride film (SiN), a silicon oxide film containing nitrogen (SiO$_x$N$_y$:x>y>0), or a layered film thereof is formed by plasma CVD or sputtering. Naturally, the first interlayer insulating film 530 is not limited to a silicon oxide film containing nitrogen, a silicon nitride film, or a layered film thereof, and another insulating film containing silicon may be formed in a single layer or layered structure.

Subsequently, hydrogenation is conducted by heating the whole at 410° C. for one hour to release hydrogen from the silicon oxide film containing nitrogen. Note that the hydrogenation is not necessary if the heat treatment carried out at 550° C. in a nitrogen atmosphere for four hours.

Next, a second interlayer insulating film 531 serving as a planarizing film is formed covering the first interlayer insulating film 530.

As the second interlayer insulating film 531, a photosensitive or non-photosensitive organic material (polyimide, acrylic, polyamide, polyimide amide, resist, or benzocyclobutene), a material called siloxane, which is composed of a skeleton formed by the bond of silicon (Si) and oxygen (O) (Si—O—Si bond), which contains at least hydrogen as a substituent, or contains one of fluorine, an alkyl group, and aromatic hydrocarbon, or a stack thereof can be used. As the organic material, positive photosensitive organic resin or negative photosensitive organic resin can be used.

In this embodiment mode, siloxane is formed as the second interlayer insulating film 531 by spin coating.

The first interlayer insulating film 530 and the second interlayer insulating film 531 are etched to form a contact hole which reaches the island-shaped semiconductor films 507 to 509 in the first interlayer insulating film 530 and the second interlayer insulating film 531.

A third interlayer insulating film may be formed over the second interlayer insulating film 531 and a contact hole may be formed in the first, second, and third interlayer insulating films. As the third interlayer insulating film, a film which hardly transmits moisture, oxygen, and the like, compared to another insulating film, is used. Typically, a silicon nitride film, a silicon oxide film, a silicon nitride film containing oxygen (a SiN$_x$O$_y$ film (x>y>0) or a SiO$_x$N$_y$ film (x>y>0)), a thin film containing carbon as a main component (for example, a DLC film or a CN film), or the like which can be obtained by sputtering or CVD can be used.

A third conductive film is formed over the second interlayer insulating film 531 through the contact hole, and the third conductive film is selectively etched to form electrodes or wirings 540 to 544.

In this embodiment mode, a metal film is used as the third conductive film. As the metal film, a film containing an element of aluminum (Al), titanium (Ti), molybdenum (Mo), tungsten (W), or silicon (Si), or an alloy film using these elements may be used. In this embodiment mode, a titanium film (Ti), a titanium nitride film (TiN), a silicon-aluminum alloy film (Al—Si), and a titanium film (Ti) are formed to thicknesses of 60 nm, 40 nm, 300 nm, and 100 nm, respectively, and selectively etched into desired shapes to form the electrodes or wirings 540 to 544.

These electrodes or wirings 540 to 544 may be formed from an aluminum alloy film containing carbon and at least one element of nickel, cobalt, or iron. Such an aluminum alloy film can prevent the interactive diffusion of silicon and aluminum even when the aluminum alloy film contacts silicon. Further, since an oxidation-reduction reaction does not occur even when such an aluminum alloy film contacts a transparent conductive film such as an ITO (Indium Tin Oxide) film, they can be directly contacted. Moreover, such an aluminum alloy film has low specific resistance and high heat resistance, so that it is useful a wiring material.

The electrodes or wirings 540 to 544 may be formed by simultaneously forming electrodes and wirings. Alternatively, electrodes and wirings which are formed separately may be connected.

According to a series of the above steps, a semiconductor device including a CMOS circuit 553 having the n-channel TFT 550 and the p-channel TFT 551, and the n-channel TFT 552 can be formed (FIG. 10C). The method of manufacturing a semiconductor device is not limited to the above-mentioned manufacturing steps of after forming the island-shaped semiconductor films. Further, the semiconductor device may include a TFT using an amorphous semiconductor film or a TFT using a single crystal semiconductor film.

Embodiment Mode 3

Here, an example of manufacturing a liquid crystal display device (Liquid Crystal Display (LCD)) will be described.

A method of manufacturing a display device which is explained in this embodiment mode is a method of concurrently manufacturing a pixel area including a pixel TFT and a TFT of a driver circuit area provided in the periphery of the pixel area. As for a driver circuit, a CMOS circuit which is a basic unit is shown for simplifying the description.

First, the steps up to forming electrodes or wirings 540 to 544 shown in FIG. 10C are conducted based on the method described in this embodiment mode. Note that the same parts as that the above embodiment mode are denoted by the same reference numerals.

Next, a third interlayer insulating film 610 is formed over a second interlayer insulating film 531 and the electrodes or wirings 540 to 544. The third interlayer insulating film 610 can be formed using the similar material as the second interlayer insulating film 531.

Then, a resist mask is formed using a photo mask, and a part of the third interlayer insulating film 610 is removed by dry etching and opened (contact hole is formed). In forming this contact hole, carbon tetrafluoride (CF$_4$), oxygen (O$_2$), and helium (He) are used as etching gas at flow rates of 50 sccm, 50 sccm, and 30 sccm, respectively. The bottom portion of the contact hole reaches the electrode or wiring 544.

Next, after removing the resist mask, a fourth conductive film is formed all over the surface. Then, the fourth conductive film is selectively etched using a photo mask, and thereby a pixel electrode 623 to be electrically connected to the electrode or wiring 544 is formed (FIG. 11). In this embodiment mode, since a reflective liquid crystal display panel is manufactured, the pixel electrode 623 may be formed from a light reflective metal material such as Ag (silver), Au (gold), Cu (copper), W (tungsten), or Al (aluminum) by sputtering.

In the case of manufacturing a transmissive liquid crystal display panel, the pixel electrode 623 is formed using a transparent conductive film of indium tin oxide (ITO), indium tin oxide containing silicon oxide, zinc oxide (ZnO), tin oxide (SnO$_2$), or the like.

FIG. 13 shows a magnified top view of a part of the pixel area 650 including a pixel TFT. In addition, FIG. 13 shows the pixel electrode in process. The pixel electrode is formed in the left pixel but the pixel electrode is not formed in the right pixel. In FIG. 13, the drawing taken along solid line A-A' corresponds to a cross section of a pixel area in FIG. 11 and the parts corresponding to those in FIG. 11 are denoted by the same reference numerals.

As shown in FIG. 13, a gate electrode 572 is connected to a gate wiring 630. An electrode 543 is integrated with a source wiring.

A capacitor wiring 631 is provided, and a storage capacitor is formed of a pixel electrode 623 and the capacitor wiring 631 which overlaps the pixel electrode by using a first interlayer insulating film 530 as a dielectric.

In this embodiment mode, the second interlayer insulating film 531 and the third interlayer insulating film 610 are etched in the region where the pixel electrode 623 and the capacitor wiring 631 overlap, and the storage capacitor is formed of the pixel electrode 623, the first interlayer insulating film 530, and the capacitor wiring 631. However, if the second interlayer insulating film 531 and the third interlayer insulating film 610 can also be used as dielectrics, the second interlayer insulating film 531 and the third interlayer insulating film 610 are not required to be etched. In that case, the first interlayer insulating film 530, the second interlayer insulating film 531, and the third interlayer insulating film 610 serve as dielectrics. Alternatively, only the third interlayer insulating film 610 may be etched, and the first interlayer insulating film 530 and the second interlayer insulating film 531 may be used as dielectrics.

Through the above steps, a TFT substrate of a liquid crystal display device in which a top-gate pixel TFT 552, a CMOS circuit 553 including a top-gate n-channel TFT 550 and a top-gate p-channel TFT 551, and the pixel electrode 623 are formed over a substrate 500 is completed. Although a top-gate TFT is formed in this embodiment mode, a bottom-gate TFT can be used as appropriate.

Next, the IC 3 is mounted on the substrate 500. The driver IC is electrically connected by aligning a solder bump formed on the IC to a terminal pad formed on the substrate 500, bringing them into contact with each other, and thereafter heating and melting the solder bump. Alternatively, the connection is made by what is called a wire bonding method, in which a terminal protruding from an IC and a terminal on the substrate are connected with a wire (not shown). Thereafter, the layer for controlling substrate gap (spacer layer) 4 is, for example, disposed over the CMOS circuit 553 included in a scan line driver circuit, as shown in FIG. 3, to control the level difference on the substrate 500 (FIG. 12).

Subsequently, an orientation film 624a is formed so as to cover the pixel electrode 623. Note that the orientation film 624a may use a droplet discharge method, screen printing, offset printing, or the like. Thereafter, the surface of the orientation film 624a is rubbed.

Then, a color filter including a colored layer 626a, a light shielding layer (black matrix) 626b, and an overcoat layer 627 is provided on a counter substrate 625. Moreover, a counter electrode 628 including a transparent electrode or a reflective electrode is formed, and an orientation film 624b is formed thereover (FIG. 12). A substrate having the same size as the substrate 500 may be used as the counter substrate 625. Here, the same size or the same shape is not necessarily strictly the same, and it refers to the size or shape sufficient to constitute a panel. Next, a seal material 600 which is a closed pattern is formed by a droplet discharge method so as to surround a region overlapping the pixel area 650 including the pixel TFT (FIG. 12, FIG. 14(A)). Since a liquid crystal is dropped here, an example of drawing with the seal material 600 of the closed pattern is described; however, a dip method (pumping method) may also be used in which a liquid crystal is injected using a capillary phenomenon after providing a seal pattern having an opening and pasting the substrate 500.

Next, a liquid crystal composition 629 is dropped under low pressure so that a bubble does not enter (FIG. 14B), and then both substrates 500 and 625 are pasted (FIG. 14C). A liquid crystal is dropped once or plural times within the seal pattern of a closed loop. As an orientation mode of the liquid crystal composition 629, a TN mode in which the arrangement of liquid crystal molecules is twisted at 90° from the incidence direction of light to the emission direction is used. The substrates are pasted so that the rubbing directions of the substrates intersect.

Next, the substrate is divided. In the case of taking out many panels, the respective panels are divided. In the case of taking out one panel, a dividing step can be omitted by pasting the counter substrate which has been cut in advance (FIG. 12, FIG. 14D).

Then, an FPC (Flexible Printed Circuit) is pasted with an anisotropic conductive layer in-between by a known technique. Through these steps, a liquid crystal display device is completed. Further, an optical film is pasted if necessary. In the case of a transmissive liquid crystal display device, a polarizing plate is pasted on both the TFT substrate and the counter substrate.

As described above, in this embodiment mode, a liquid crystal display device can be manufactured using a method described in the above embodiment modes and further using a TFT including a crystalline semiconductor film. Thus, a highly reliable liquid crystal display device can be manufactured. Liquid crystal display devices manufactured in accordance with this embodiment mode can be used for display portions of various electronic apparatuses.

Although the TFT is a top-gate TFT in this embodiment mode, the invention is not limited to the structure. A bottom-gate (inverted-staggered) TFT or a staggered TFT can also be employed as appropriate. Further, not only the TFT having a single gate structure but also a multi-gate structure TFT having a plurality of channel formation regions, for example a double-gate TFT, can be used.

This embodiment mode can be freely combined with any description of the embodiment modes above if necessary.

Embodiment Mode 4

Here, an example of manufacturing a dual emission display device to which the present invention can be applied will be described.

First, island-shaped semiconductor films 507 to 509 in FIG. 8(C) are formed based on the embodiment mode. In addition, the same parts as the above embodiment modes are denoted by the same reference numerals.

Next, an impurity is introduced into the island-shaped semiconductor films 507 to 509 in order to control a threshold value. In this embodiment mode, boron (B) is introduced into the island-shaped semiconductor films by doping with diborane ($B_2H_6$).

Next, an insulating film 700 is formed so as to cover the island-shaped semiconductor films 507 to 509 (FIG. 15(A)). As the insulating film 700, for example, silicon oxide (SiO), silicon nitride (SiN), silicon oxide containing nitrogen ($SiO_xN_y$:x>y>0), or the like can be used. As the film formation method, plasma CVD, sputtering, or the like can be used.

Next, after a conductive film is formed over the insulating film 700, the conductive film is selectively etched to form gate electrodes 707 to 709.

The gate electrodes 707 to 709 are formed with a single layer of a conductive film or with a structure in which two or more conductive films are stacked. In the case of stacking the two or more conductive films, the gate electrodes 707 to 709 may be formed by stacking an element selected from tantalum (Ta), tungsten (W), titanium (Ti), molybdenum (Mo), or aluminum (Al), or an alloy material or a compound material containing the above element as its main component. Alternatively, the gate electrodes may be formed using a semiconductor film typified by a polycrystalline silicon film doped with an impurity element such as phosphorus (P).

In this embodiment mode, the gate electrodes 707 to 709 are formed using a layered film of tantalum nitride (TaN) and tungsten (W) to thicknesses of 30 nm and 370 nm respectively. In this embodiment mode, upper layer gate electrodes 701 to 703 are formed using tungsten (W), and lower layer gate electrodes 704 to 706 are formed using tantalum nitride (TaN).

The gate electrodes 707 to 709 may be formed as a part of a gate wiring. Alternatively, another gate wiring may be formed and the gate electrodes 707 to 709 may be connected thereto.

A source region, a drain region, a low concentration impurity region, and the like are formed by doping the island-like semiconductor films 507 to 509 with impurities which impart n or p type conductivity using the gate electrodes 707 to 709 or a resist which is selectively formed as masks.

First, impurities are selectively added to the island-like semiconductor films 507 and 508 to be the n-channel TFTs 761 and 762. Phosphorous (P) is introduced into the 507 to 509 using phosphine ($PH_3$) at an acceleration voltage of 60 to 120 keV, and with a dose of $1 \times 10^{13}$ to $1 \times 10^{15}$ cm$^{-2}$. The introduction of impurities permits channel formation regions 713 and 716 of the n-channel TFTs 761 and 762.

In order to manufacture a p-channel TFT, impurities are added to the island-like semiconductor film 509 to be a p-channel TFT 763. Boron is introduced into the island-like semiconductor film using diborane ($B_2H_6$) under the conditions of an applied voltage of 60 to 100 keV, for example, 80 keV, and a dose of $1 \times 10^{13}$ to $5 \times 10^{15}$ cm$^{-2}$, for example, $3 \times 10^{15}$ cm$^{-2}$. Accordingly, a source region or drain region 717 of the p-channel TFT 763 is formed and a channel formation region 718 is formed by the impurity introduction (FIG. 15(A)).

Sequentially, gate insulating films 721 to 723 are formed by selectively etching the insulating film 700.

After forming the gate insulating films 721 to 723, phosphorous (P) is introduced into the island-like semiconductor films 507 and 508 to be the n-channel TFTs 761 and 762 respectively using phosphine ($PH_3$) at an applied voltage of 40 to 80 keV, for example, 50 keV, and with a dose of $1.0 \times 10^{15}$ to $2.5 \times 10^{16}$ cm$^{-2}$, for example, $3.0 \times 10^{15}$ cm$^{-2}$. Accordingly, low concentration impurity regions 712 and 715, source or drain regions 711 and 714 of the n-channel TFTs 761 and 762 are formed (FIG. 15(B)).

In this embodiment mode, phosphorous (P) is contained at a concentration of $1 \times 10^{19}$ to $5 \times 10^{21}$ cm$^{-3}$ in the source or drain regions 711 and 714 of the n-channel TFTs 761 and 762 respectively. Further, phosphorous (P) is contained at a concentration of $1 \times 10^{18}$ to $5 \times 10^{19}$ cm$^{-3}$ in the low concentration impurity region 712 and 715 of the n-channel TFT 761 and 762 respectively. Furthermore, boron (B) is contained at a concentration of $1 \times 10^{19}$ to $5 \times 10^{21}$ cm$^{-3}$ in the source or drain region 717 of the p-channel TFT 763.

In this embodiment mode, the p-channel TFT 763 is used as a pixel TFT of a dual emission display device. The n-channel TFTs 761 and 762 are used as TFTs of a driver circuit for driving the pixel TFT 763. It is to be noted that the pixel TFT is not required to be a p-channel TFT, and may be an n-channel TFT. Further, it is not necessary that the driver circuit should be a circuit in which a plurality of n-channel TFTs are combined, and may be a circuit in which an n-channel TFT and a p-channel TFT are combined complementally, or a circuit in which a plurality of p-channel TFTs are combined.

Next, insulating film 730 containing hydrogen is formed and the impurity element added to the island-shaped semiconductor films are activated thereafter. The activation of the impurity element may be conducted by a laser processing method shown in the above embodiment mode. Alternatively, after the insulating film containing hydrogen is formed, the impurities may be activated by heating the insulating film in a nitrogen atmosphere at 550° C. for four hours.

A silicon oxide film containing nitrogen ($SiO_xN_y$ film: x>y>0) obtained by PCVD is used for the insulating film containing hydrogen. Alternatively, a silicon nitride film containing oxygen ($SiN_xO_y$ film:x>y>0) may be used. In the case where the semiconductor films are crystallized by using a metal element which promotes crystallization as typified by nickel, gettering can also be carried out for reduction of nickel in the channel formation regions at the same time as the activation of the impurity element. Note that the insulating film 730 containing hydrogen is a first interlayer insulating film, which is a light-transmitting insulating film containing silicon oxide.

Then the island-like semiconductor films are hydrogenated by heating the whole at 410° C. for an hour.

Next, a planarization film is formed as a second interlayer insulating film 731. As the planarization film, a light-transmitting inorganic material (silicon oxide, silicon nitride, silicon nitride containing oxygen, and the like), a photosensitive or nonphotosensitive organic material (polyimide, acrylic, polyamide, polyimide amide, resist, or benzocyclobutene), a stack of them, or the like is used. Further, as another light-transmitting film used for the planarization film, an insulating film formed of a silicon oxide film containing an alkyl group obtained by a coating method can be used. For example, an insulating film can be used, which is formed using silica glass, an alkyl siloxane polymer, an alkylsilsesquioxane polymer, a hydrogenated silsesquioxane polymer or the like. As examples of a siloxane polymer, there are PSB-K1 and PSB-K31 which are coating insulating film materials produced by Toray industries Inc and ZRS-5PH which is a coating insulating film material.

Then a third interlayer insulating film 732 which transmit light is formed. The third interlayer insulating film 732 is provided as an etching stopper film for protecting the planarization film which is the second interlayer insulating film 731 when selectively etching a transparent electrode 750 in a subsequent step. It is to be noted that, in the case where the second interlayer insulating film 731 becomes an etching stopper film when selectively etching the transparent electrode 750, the third interlayer insulating film 732 is not needed.

Then, contact holes are formed in the first interlayer insulating film 730, the second interlayer insulating film 731, and the third interlayer insulating film 732 using a new mask. After the mask is removed and a conductive film (layered film of TiN, Al and TiN) is formed, it is etched (by dry etching with a mixed gas of $BCl_3$ and $Cl_2$) using another mask so as to form electrodes or wirings 741 to 745 (a source wiring and a drain wiring of a TFT, a current supply wiring, and the like) (FIG. 15(C)). It is to be noted that the electrodes and wirings may be formed separately and electrically connected to one another although the electrodes and the wirings are formed integrally in this embodiment mode. Note that TiN is one of materials which has high adhesion with a high heat-resistant planarization film. In addition, it is preferable that the N content in TiN be less than 44 atomic % to obtain good ohmic contact with a source region or a drain region of the TFT.

Next, a transparent electrode 750, that is an anode of an organic light-emitting element is formed to a thickness of 10 nm to 800 nm using a new mask.

As the transparent electrode 750, a high work function (work function 4.0 eV or more) transparent conductive material such as indium tin oxide (ITO), IZO (Indium Zinc Oxide) obtained by mixing 2 to 20% of zinc oxide (ZnO) with ITO or indium oxide, which contains Si elements can be used (FIG. 16(A)).

Subsequently, an insulator 733 (referred to as a partition wall, a barrier wall, a bank, or the like) covering an end of the transparent electrode 750 is formed using a new mask. As the insulator 733, a photosensitive or nonphotosensitive organic material obtained by a coating method (polyimide, acrylic, polyamide, polyimide amide, resist, or benzocyclobutene), or a SOG film (for example, a SiOx film containing an alkyl group) is used in a thickness range of 0.8 μm to 1 μm.

Subsequently, a first layer 751, a second layer 752, a third layer 753, a fourth layer 754, and a fifth layer 755 which contains an organic compound are formed by vapor deposition or by a coating method. Note that degasification is preferably performed in order to improve reliability of the light-emitting element by vacuum heating before the first layer 751 is formed. For example, heat treatment is preferably carried out at 200° C. to 300° C. under a reduced pressure atmosphere or an inert atmosphere in order to remove gas contained in the substrate before depositing the organic compound material. Note that heat treatment at higher temperature (410° C.) can be applied in the case where the interlayer insulating films and the partition wall are formed with SiO$_x$ films having high heat resistance.

First, molybdenum oxide (MoO$_x$), 4,4'-bis[N-(1 naph-thyl)-N-phenyl-amino]-biphenyl (α-NPD) and rubrene are selectively co-deposited over the transparent electrode 750 using a deposition mask so as to form the layer containing an organic compound (first layer) 751.

Note that a material having a high hole injection property such as copper phthalocyanine (CuPC), vanadium oxide (VO$_x$), ruthenium oxide (RuO$_x$), or tungsten oxide (WO$_x$) can be used besides MoO$_x$. Alternatively, a high molecular weight material having a high hole injection property such as poly (ethylene dioxythiophene)/poly(styrene sulfonate) aqueous solution (PEDOT/PSS) formed by a coating method may be used as the first layer containing an organic compound (first layer) 751.

Subsequently, a hole transporting layer (second layer) 752 is formed over the first layer containing an organic compound (first layer) 751 by selectively depositing α-NPD using a deposition mask. Note that a material having a high hole transporting property as typified by an aromatic amine-based compound such as 4,4'-bis[N-(3-methylphenyl)-N-phenyl-amino]-biphenyl (abbreviated as TPD), 4,4',4"-tris[N,N-diphenyl-amino]-triphenylamine (abbreviated as TDATA), 4,4',4"-tris[N-(3-methylphenyl)-N-phenyl-amino]-tripheny-lamine (abbreviated as MTDATA), or the like can be used besides α-NPD.

A light-emitting layer 753 (third layer) is selectively formed thereafter. The deposition masks are selectively deposited respectively and aligned for respective light-emission colors (R, G, and B) so that the device can perform full color display.

As a light-emitting layer 753R which emits red light, a material such as Alq$_3$:DCM or Alq$_3$:rubrene:BisDCJTM is used. As a light-emitting layer 753G which emits green light, a material such as Alq$_3$ : DMQD (N,N'-dimethyl quinacri-done) or Alq$_3$:coumarin 6 is used. As a light-emitting layer 753B which emits blue light, a material such as α-NPD or tBu-DNA is used (FIG. 8).

Subsequently, an electron transporting layer (fourth layer) 754 is formed over the light-emitting layer 753 by selectively depositing Alq$_3$ (tris(8-quinolinolato)aluminum) using a deposition mask. Note that a material having a high electron transporting property as typified by a metal complex or the like having a quinoline skeleton or a benzoquinoline skeleton, such as tris(5-methyl-8-quinolinolato) aluminum (abbreviated as Almq$_3$), bis(10-hydroxybenzo[h]-quinolinato)beryl-lium (abbreviated as BeBq$_2$), or bis(2-methyl-8-quinolino-lato)-4-phenylphenolato-aluminum (abbreviated as BAlq) can be used besides Alq$_3$. Other than these, a metal complex having oxazole-based or thiazole-based ligands such as bis [2-(2-hydroxyphenyl)-benzoxazolato]zinc (abbreviated as Zn (BOX)$_2$), or bis[2-(2-hydroxyphenyl)-benzothiazolato] zinc (abbreviated as Zn(BTZ)$_2$) can be used. In addition to the metal complex, 2-(4-biphenylyl)-5-(4-tert-buthylphenyl)-1, 3,4-oxadiazole (abbreviated as PBD), 1,3-bis[5-(p-tert-bu-tylphenyl)-1,3,4-oxadiazole-2-yl]benzene (abbreviated as OXD-7), 3-(4-tert-butylphenyl)-4-phenyl-5-(4-biphenylyl)-1,2,4-triazole (abbreviated as TAZ), 3-(4-tert-butylphenyl)-4-(4-ethylphenyl)-5-(4-biphenylyl)-1,2,4-triazole (abbreviated as p-EtTAZ), bathophenanthroline (abbreviated as BPhen), bathocuproine (abbreviated as BCP), or the like can be used as the electron transporting layer 754 because they have a high electron transporting property.

An electron injection layer (fifth layer) 755 is formed so as to cover the entire surface of the electron transporting layer and the insulator by co-depositing 4,4'-bis(5-methylbenzox-azole-2-yl) stilbene (abbreviated as BzOs), and lithium (Li). A damage due to sputtering in forming a transparent electrode 756 in a subsequent step is suppressed by using a benzoxazole derivative (BzOS). Note that a material having a high electron injection property such as an alkali metal or an alkaline earth metal such as calcium fluoride (CaF$_2$), or lithium fluoride (LiF), cesium fluoride (CsF), besides BzOs : Li can be used. Alternatively, a mixture of Alq$_3$ and magnesium (Mg) can be used.

Next, a transparent electrode 756, that is a cathode of an organic light-emitting element is formed to a thickness of 10 nm to 800 nm over the fifth layer 755. For example, the transparent electrode 756 can be formed using as well as indium tin oxide (ITO), IZO (Indium Zinc Oxide) which is obtained by mixing ITO containing Si elements or indium oxide with 2 to 20 atomic % of zinc oxide (ZnO).

A light-emitting element is manufacture as described above. Respective materials and respective film thicknesses of the anode, the layers containing an organic compound (the first layer to the fifth layer), and the cathode which constitute the light-emitting element are selected and adjusted appropriately. It is desirable that the anode and the cathode be formed with the same material and almost the same film thickness, preferably about 100 nm.

If necessary, a transparent protective layer 757 for preventing moisture penetration is formed so as to cover the light-emitting element. As the light-transmitting protective film 757, a silicon nitride film, a silicon oxide film, a silicon nitride film containing oxygen (SiNO film (composition ratio: N>O)), or a silicon oxide film containing nitrogen (SiON film (composition ratio: N<O)), a thin film mainly composed of carbon (for example, a DLC (diamond-like carbon) film or a CN film), or the like which is obtained by sputtering or CVD can be used (FIG. 16(B)).

Next, the IC 3 is mounted on the substrate 500. The IC 3 is electrically connected by aligning a solder bump formed on the IC 3 to a terminal pad formed on the substrate 500, bringing them into contact with each other, and thereafter heating and melting the solder bump. Alternatively, the connection is made by what is called a wire bonding method, in which a terminal protruding from an IC and a terminal on the substrate are connected with a wire (not shown). Thereafter, the layer for controlling substrate gap (spacer layer) 4 is, for example, disposed over the n-channel TFTs 761 and 762 included in a driver circuit, as shown in FIG. 3, to control the level difference on the substrate 500 (FIG. 16(B)).

A second substrate 770 and the substrate 500 are attached to each other with a sealing material for keeping space between the substrates. A glass substrate, a quartz substrate, or the like which transmit light may be used for the second substrate 770. A substrate having the same size as a first substrate 500 may be used as the second substrate 770. Here, the same size or the same shape is not necessarily strictly the same, and it refers to the size or shape sufficient to constitute a panel. The space between the pair of substrates may dispose a desiccant therein as a space (inert gas). Alternatively, the space between a pair of substrates may be filled with a transparent sealing material (such as ultraviolet-curable, thermosetting epoxy resin).

Since each of the transparent electrodes 750 and 756 is formed of a transparent material, the light-emitting element can emit light in two directions, that is, to both sides.

The panel structure as described above enables almost the same light emission from the top side and from the bottom side.

Finally, optical films (polarizing plate or circularly polarizing plate) 771 and 772 are provided so as to improve contrast (FIG. 7).

FIG. 18 shows a cross-sectional view of light emitting elements for respective light-emission colors (R, G, and B). The red (R) light-emitting element includes a pixel TFT 763R, a transparent electrode (anode) 750R, a first layer 751R, a second layer (hole transporting layer) 752R, a third layer (light-emitting layer) 753R, a forth layer (electron transporting layer) 754R, a fifth layer (electron injection layer) 755, a transparent electrode (cathode) 756, and a transparent protective layer 757.

The green (G) light-emitting element includes a pixel TFT 763G, a transparent electrode (anode) 750G, a first layer 751G, a second layer (hole transporting layer) 752G, a third layer (light-emitting layer) 753G, a forth layer (electron transporting layer) 754G, a fifth layer (electron injection layer) 755, a transparent electrode (cathode) 756, and a transparent protective layer 757.

The blue (B) light-emitting element includes a pixel TFT 763B, a transparent electrode (anode) 750B, a first layer 751B, a second layer (hole transporting layer) 752B, a third layer (light-emitting layer) 753B, a forth layer (electron transporting layer) 754B, a fifth layer (electron injection layer) 755, a transparent electrode (cathode) 756, and a transparent protective layer 757.

In this embodiment mode, TFTs are top-gate TFTs. However, the invention is not limited to this structure and a bottom-gate (inverted staggered) TFT or a staggered TFT can also be used as appropriate. Further, the invention is not limited to a single-gate TFT; a multi-gate TFT having a plurality of channel formation regions such as a double-gate TFT may be used.

Further, this embodiment mode can be freely combined with any description of the above embodiment modes as necessary.

Embodiment Mode 5

As examples of electronic apparatuses to which the present invention is applied, there are a video camera, a digital camera, a goggle type display, a navigation system, an audio-reproducing device (a car audio component stereo or the like), a computer, a game machine, a portable information terminal (a mobile computer, a mobile phone, a mobile game machine, an electronic book, or the like), an image-reproducing device having a recording medium (specifically, a device for reproducing the content of a recording medium such as a digital versatile disk (DVD) and having a display for displaying the reproduced image, and the like. The examples of the electronic apparatuses are shown below.

FIG. 19 shows a liquid crystal module or an EL module, in which a display panel 5001 and a circuit substrate 5011 are combined. On the circuit substrate 5011, a control circuit 5012, a signal dividing circuit 5013, and the like are formed and electrically connected to the display panel 5001 with a connection wiring 5014.

The display panel 5001 has a pixel area 5002 in which a plurality of pixels are provided, a scan line driver circuit 5003, a signal line driver circuit 5004 for supplying a selected pixel with video signals. Note that, in the case of manufacturing an EL module or a liquid crystal module, the display panel 5001 may be manufactured using the aforementioned embodiment mode.

A liquid crystal television receiver or an EL television receiver can be completed by using a liquid crystal module or an EL module which is shown in FIG. 19. FIG. 20 is a block diagram which shows a main structure of a liquid crystal television receiver or an EL television receiver. A tuner 5101 receives image signals and audio signals. The image signals are processed by an image signal amplifier circuit 5102, an image signal processing circuit 5103 which converts signals output from the image signal amplifier circuit 5102 to respective color signals corresponding to red, green, and blue, and a control circuit 5012 for converting the image signals to meet the input specification of a driver IC. The control circuit 5012 outputs signals severally to a scan line side and a signal line side. In the case of digital driving, a structure in which the signal line side may be provided with a signal dividing circuit 5013 so that an input digital signal is divided into m signals to be supplied may be used.

Among signals received by the tuner 5101, audio signals are sent to an audio signal amplifier circuit 5105, and the output is supplied to a speaker 5107 through an audio signal processing circuit 5106. The control circuit 5108 receives control data such as a receiving station (reception frequency) and a volume from an input portion 5109, and sends out signals to the tuner 5101 and the audio signal processing circuit 5106.

A liquid crystal module or an EL module is incorporated in a housing 5201 so as to complete a television receiver as shown in FIG. 21(A). A display panel 5202 is formed with a liquid crystal display or an EL module. A speaker 5203, an operation switch 5204, and the like are provided as appropriate.

FIG. 21(B) shows a wireless television receiver which has a portable display. A battery and a signal receiver are incorporated in a housing 5212, and the battery drives a display portion 5213 and a speaker portion 5217. The battery can be charged repeatedly using a charger 5210. Further, the charger 5210 can send and receive image signals, and can send the image signals to the signal receiver of the display. The housing 5212 is controlled by an operation key 5216. The device shown in FIG. 21(B) can be regarded as an image and audio interactive communication device since signals can be sent from the housing 5212 to the charger 5210 by controlling the operation key 5216. The device can also be regarded as a universal remote-control device since signals are sent from the housing 5212 to the charger 5210 by controlling the operation key 5216 and signals which can be sent by the charger 5210 are received by another electronic apparatus so that communication of another electronic apparatus can be controlled. The invention can be applied to the display portion 5213.

By applying the invention to the television receivers shown in FIGS. 19 to 21, highly reliable television receivers can be manufactured.

Naturally, the invention is not limited to the television receiver, and can be applied to various usages, for example, a large-size display medium such as an information display board in a train station, an airport, and the like, or an advertisement display board on the street, as well as a monitor of a personal computer.

FIG. 22(A) shows a module in which a display panel 5301 and a printed wiring board 5302 are combined. The display panel 5301 is equipped with a pixel area 5303 provided with a plurality of pixels, a first scan line driver circuit 5304, a second scan line driver circuit 5305, and a signal line driver circuit 5306 for supplying a video signal to a selected pixel.

The printed wiring board 5302 is provided with a controller 5307, a central processing unit (CPU) 5308, a memory 5309, a power supply circuit 5310, an audio processing circuit 5311, a transmitter/receiver circuit 5312, and the like. The printed wiring board 5302 is connected to the display panel 5301 through a flexible printed circuit (FPC) 5313. The printed wiring board 5302 may have a structure in which a capacitor element, a buffer circuit, and the like are provided to prevent noise from causing in power supply voltage or a signal or the rising of a signal from dulling. The controller 5307, the audio processing circuit 5311, the memory 5309, the CPU 5308, the power supply circuit 5310, and the like can be mounted on the display panel 5301 using a COG (Chip on Glass) method. By means of the COG method, the scale of the printed wiring board 5302 can be reduced.

Various control signals are inputted or outputted through an interface (I/F) portion 5314 which is provided on the printed wiring board 5302. An antenna port 5315 for sending and receiving signals to/from an antenna is provided on the printed wiring board 5302.

FIG. 22(B) shows a block diagram of the module shown in FIG. 22(A). The module includes a VRAM 5316, a DRAM 5317, a flash memory 5318, and the like as a memory 5309. The VRAM 5316 stores data on an image displayed on a panel, the DRAM 5317 stores image data or audio data, and the flash memory stores various programs.

A power supply circuit 5310 supplies electric power for operating a display panel 5301, a controller 5307, a CPU 5308, an audio processing circuit 5311, the memory 5309, and a transmitter/receiver circuit 5312. A current source may be provided on the power supply circuit 5310 depending on the panel specification.

The CPU 5308 includes a control signal generation circuit 5320, a decoder 5321, a register 5322, an arithmetic circuit 5323, a RAM 5324, an interface 5366 for the CPU 5308, and the like. Various signals inputted to the CPU 5308 through the interface 5366 is once stored in the register 5322, and thereafter inputted to the arithmetic circuit 5323, the decoder 5321, or the like. The arithmetic circuit 5323 performs an arithmetical operation based on the inputted signal to specify a location to which various instructions are sent. On the other hand, the signal inputted to the decoder 5321 is decoded and inputted to the control signal generation circuit 5320. The control signal generation circuit 5320 generates a signal including various instructions based on the inputted signal to send the generated signal to the location which is specified in the arithmetic circuit 5323, specifically, to the memory 5309, the transmitter/receiver circuit 5312, the audio processing circuit 5311, the controller 5307, and the like.

The memory 5309, the transmitter/receiver circuit 5312, the audio processing circuit 5311, and the controller 5307 each operate in accordance with each of the received instructions. The operation will be briefly explained below.

The signal inputted from an input means 5325 is sent to the CPU 5308 mounted on the printed wiring board 5302 through an I/F portion 5319. The control signal generation circuit 5320 converts image data stored in the VRAM 5316 into a predetermined format to send the converted data to the controller 5307 in accordance with the signal sent from the input means 5325 such as a pointing device or a keyboard.

The controller 5307 processes data of the signal including the image data sent from the CPU 5308 in accordance with the panel specification to supply the signal to the display panel 5301. Further, the controller 5307 generates a Hsync signal, a Vsync signal, a clock signal CLK, an alternating voltage (AC Cont), and a switching signal L/R based on power supply voltage inputted from the power supply circuit 5310 or various signals inputted from the CPU 5308 to supply the signals to the display panel 5301

The transmitter/receiver circuit 5312 processes a signal which is to be sent or received as an electric wave by an antenna 5328, specifically, the transmitter/receiver circuit 5312 includes a high frequency circuit such as an isolator, a band pass filter, a VCO (Voltage Controlled Oscillator), an LPF (Low Pass Filter), a coupler, or a balun. A signal including audio information among signals which are sent or received in the transmitter/receiver circuit 5312 is sent to the audio processing circuit 5311 in accordance with an instruction from the CPU 5308.

The signal including audio information which is sent in accordance with the instruction from the CPU 5308 is demodulated in the audio processing circuit 5311 and sent to a speaker 5327. An audio signal sent from a microphone 5326 is modulated in the audio processing circuit 5311 and sent to the transmitter/receiver circuit 5312 in accordance with an instruction from the CPU 5308.

The controller 5307, the CPU 5308, the power supply circuit 5310, the audio processing circuit 5311, and the memory 5309, and the like can be mounted as a package in accordance with this embodiment mode.

FIG. 23 shows one mode of a mobile phone including a module shown in FIG. 22. A display panel 5301 is incorporated into a housing 5330 so as to be freely detached/attached. The shape or the size of the housing 5330 can be appropriately changed depending on the size of the display panel 5301. The housing 5330 to which the display panel 5301 is fixed is fitted into a printed substrate 5331 and built as a module.

The display panel 5301 is connected to the printed substrate 5331 through an FPC 5313. The printed substrate 5331 is provided with a speaker 5332, a microphone 5333, a transmitter/receiver circuit 5334, and a signal processing circuit 5335 including a CPU, a controller, and the like. Such a module is combined with an input means 5336, a battery 5337, and an antenna 5340 to be stored in a chassis 5339. A pixel area of the display panel 5301 is arranged so as to be visible through an opening window which is provided on the chassis 5339.

The mobile phone in accordance with this embodiment mode can be transformed into various modes depending on its functions or usages. For example, the mobile phone can have the foregoing operation and effect even when the mobile phone is manufactured to have a plurality of display panels or have an opening and shutting structure with a hinge by dividing the chassis into a plurality of pieces as appropriate.

By applying the invention to the mobile phone shown in FIG. 23, a highly reliable mobile phone can be manufactured.

FIG. 24(A) shows a liquid crystal display or an OLED display, which includes a chassis 6001, a support 6002, a display portion 6003, and the like. The invention can be applied to the display portion 6003 using a structure of a liquid crystal module or an EL module shown in FIG. 19 and a display panel shown in FIG. 22(A).

A highly reliable display can be manufactured using the invention.

FIG. 24(B) shows a computer, which includes a main body 6101, a chassis 6102, a display portion 6103, a keyboard 6104, an external connection port 6105, a pointing mouse 6106, and the like. The invention can be applied to the display portion 6103 using a structure of the liquid crystal module or EL module shown in FIG. 19 and the display panel shown in FIG. 22(A).

A highly reliable computer can be manufactured using the invention.

FIG. 24(C) shows a portable computer, which includes a main body 6201, a display portion 6202, a switch 6203, an operation key 6204, an infrared port 6205, and the like. The invention can be applied to the display portion 6202 using a structure of the liquid crystal module or EL module shown in FIG. 19 and the display panel shown in FIG. 22(A).

A highly reliable computer can be manufactured using the invention.

FIG. 24(D) shows a portable game machine, which includes a chassis 6301, a display portion 6302, a speaker portion 6303, an operation key 6304, a recording medium insert portion 6305, and the like. The invention can be applied to the display portion 6302 using a structure of the liquid crystal module or EL module shown in FIG. 19 and the display panel shown in FIG. 22(A).

A highly reliable game machine can be manufactured using the invention.

FIG. 24(E) shows a portable image reproducing device provided with a recording medium (specifically, a DVD reproducing device), which includes a main body 6401, a chassis 6402, a display portion A 6403, a display portion B 6404, a recording medium (DVD or the like) reading portion 6405, an operation key 6406, a speaker portion 6407, and the like. The display portion A 6403 mainly displays image information, and the display portion B 6404 mainly displays text information. The invention can be applied to the display portion A 6403, the display portion B 6404, a control circuit portion, and the like using a structure of the liquid crystal module or EL module shown in FIG. 19 and the display panel shown in FIG. 22(A). In addition, the image reproducing device provided with a recording medium further includes a home video game machine and the like.

A highly reliable image reproducing device can be manufactured using the invention.

The display devices used in these electronic apparatus can use not only a glass substrate but also a heat-resistant plastic substrate in accordance with the size, the strength, or the intended purpose. Thus, lighter weight can be achieved.

The example shown in this embodiment is just an example, and the invention is not limited to these usages.

This embodiment can be freely combined with any description of embodiment modes described above as necessary.

What is claimed is:

1. A display device comprising:
a counter substrate over a substrate;
an IC chip over the substrate;
a driver circuit over the substrate;
a pixel region electrically connected to the driver circuit and electrically connected to the IC chip, over the substrate;
a chip capacitor over the substrate;
a first layer comprising a first resin material, wherein the first layer is in contact with the IC chip; and
a second layer comprising a second resin material, wherein the second layer is in contact with the chip capacitor,
wherein the chip capacitor is electrically connected to a first wiring and is electrically connected to a second wiring,
wherein the chip capacitor is attached to the substrate by an adhesive material,
wherein the driver circuit is overlapped with the counter substrate, and
wherein the first wiring is electrically connected to a connection terminal and is electrically connected to the IC chip.

2. A display device according to claim 1, wherein the first wiring is a voltage supply line.

3. A display device according to claim 1, wherein the IC chip is connected to the substrate by a COG method or a COP method.

4. A liquid crystal display device, an EL display device, a television, a cellular phone, a display, a computer, a game machine, or an image reproducing device, which comprises a display device described in claim 1.

5. A display device comprising:
a counter substrate over a substrate;
an IC chip over the substrate;
a driver circuit over the substrate;
a pixel region electrically connected to the driver circuit and electrically connected to the IC chip, over the substrate;
a chip capacitor over the substrate;
a first layer comprising a first resin material, wherein the first layer is in contact with the IC chip; and
a second layer comprising a second resin material, wherein the second layer is in contact with the chip capacitor;
wherein the chip capacitor is electrically connected to a first wiring and is electrically connected to a second wiring,
wherein the chip capacitor is attached to the substrate by an adhesive material,
wherein the driver circuit is overlapped with the counter substrate, and
wherein the first wiring is electrically connected to the IC chip and is electrically connected to the pixel region.

6. A display device according to claim 5, wherein the IC chip is connected to the substrate by a COG method or a COP method.

7. A liquid crystal display device, an EL display device, a television, a cellular phone, a display, a computer, a game machine, or an image reproducing device, which comprises a display device described in claim 5.

8. A display device according to claim 1, wherein the second wiring is a ground line.

9. A display device according to claim 5, wherein the first wiring is a first voltage supply line.

10. A display device according to claim 5, wherein the second wiring is a second voltage supply line.

11. A display device comprising:
a counter substrate over a substrate;
an IC chip provided over the substrate;
a driver circuit over the substrate;
a pixel region electrically connected to the driver circuit and electrically connected to the IC chip, over the substrate;
a first chip capacitor and a second chip capacitor over the substrate;
a first layer comprising a first resin material, wherein the first layer is in contact with the IC chip,
a second layer comprising a second resin material, wherein the second layer is in contact with the first chip capacitor; and
a third layer comprising a third resin material, wherein the third layer is in contact with the second chip capacitor,
wherein the first chip capacitor is electrically connected to a first wiring and a second wiring,
wherein the first chip capacitor is attached to the substrate with a first adhesive material,
wherein the second chip capacitor is electrically connected to a third wiring and a fourth wiring,
wherein the second chip capacitor is attached to the substrate with a second adhesive material,
wherein the driver circuit is overlapped with the counter substrate,
wherein the first wiring is electrically connected to a connection terminal and is electrically connected to the IC chip, and
wherein the third wiring is electrically connected to the IC chip and is electrically connected to the pixel region.

12. A display device according to claim 11, wherein the IC chip is connected to the substrate by a COG method or a COP method.

13. A liquid crystal display device, an EL display device, a television, a cellular phone, a display, a computer, a game machine, or an image reproducing device, which comprises a display device described in claim 11.

14. A display device according to claim 11, wherein the first wiring is a voltage supply line.

15. A display device according to claim 11, wherein the third wiring is a second voltage supply line.

16. A display device according to claim 11, wherein the fourth wiring is a third voltage supply line.

17. A display device according to claim 1, wherein the adhesive material is a conductive resin material.

18. A display device according to claim 5, wherein the adhesive material is a conductive resin material.

19. A display device according to claim 11, wherein the first adhesive material is a first conductive resin material, and
wherein the second adhesive material is a second conductive resin material.

20. A display device according to claim 1, further comprising a second capacitor and a third wiring,
wherein the third wiring is electrically connected to the IC chip and is electrically connected to the pixel region, and
wherein the second capacitor is electrically connected to the third wiring.

21. A display device according to claim 5, further comprising a second capacitor and a third wiring,
wherein the third wiring is electrically connected to the IC chip and is electrically connected to the pixel region, and
wherein the second capacitor is electrically connected to the third wiring.

22. A display device according to claim 11, further comprising a third capacitor and a fifth wiring,
wherein the fifth wiring is electrically connected to the IC chip and is electrically connected to the pixel region, and
wherein the third capacitor is electrically connected to the fifth wiring.

* * * * *